United States Patent [19]
Sotokawa et al.

[11] Patent Number: 5,958,600
[45] Date of Patent: Sep. 28, 1999

[54] CIRCUIT BOARD AND METHOD OF MANUFACTURING THE SAME

[75] Inventors: Hideo Sotokawa; Akira Yabushita; Takashi Inoue, all of Yokohama; Hidetaka Shigi, Ashigarashimo-gun; Mamoru Ogihara, Ashigarakami-gun; Haruhiko Matsuyama, Hiratsuka; Minoru Tanaka, Yokohama; Yasunori Narizuka, Hiratsuka, all of Japan

[73] Assignee: Hitachi, Ltd., Tokyo, Japan

[21] Appl. No.: 08/981,835

[22] PCT Filed: Jul. 10, 1996

[86] PCT No.: PCT/JP96/01909

§ 371 Date: Jan. 9, 1998

§ 102(e) Date: Jan. 9, 1998

[87] PCT Pub. No.: WO97/03542

PCT Pub. Date: Jan. 30, 1997

[30] Foreign Application Priority Data

Jul. 10, 1995 [JP] Japan .................................... 7-173100

[51] Int. Cl.[6] .............................. B32B 15/08; H05K 1/09; G03C 3/00
[52] U.S. Cl. ....................... 428/458; 428/209; 428/473.5; 428/901; 174/257; 174/258; 174/260; 174/261; 528/353; 430/14; 430/15; 430/16; 430/18; 430/313; 430/317; 430/319
[58] Field of Search ..................................... 428/209, 458, 428/473.5, 901; 174/258, 257, 260, 261; 430/14, 15, 16, 18, 313, 317, 319; 528/353

[56] References Cited

U.S. PATENT DOCUMENTS 5,536,584  7/1996  Sotokawa et al. .................... 428/473.5
5,851,681  12/1998  Matsuyama et al. ................... 428/209
5,868,949  2/1999  Sotokawa et al. ..................... 428/209

FOREIGN PATENT DOCUMENTS

| 56-118394 | 9/1981 | Japan . |
|---|---|---|
| 2-260695 | 10/1990 | Japan . |
| 4-192405 | 7/1992 | Japan . |
| 4-196390 | 7/1992 | Japan . |
| 4-248871 | 9/1992 | Japan . |
| 5-259651 | 10/1993 | Japan . |

*Primary Examiner*—Deborah Jones
*Assistant Examiner*—Cathy Lam
*Attorney, Agent, or Firm*—Antonelli, Terry, Stout & Kraus, LLP

[57] ABSTRACT

Disclosed are a highly reliable circuit board and a method of stably manufacturing the circuit board, wherein an insulator made from a specific organic insulating material is provided under a highly stressed conductor for preventing occurrence of cracks in the insulator. In addition, a method of correcting a wiring of a ceramic board is additionally adopted. The circuit board includes a thick film wiring board 1 having a first conductor pattern 2 and a thin film layer laminated on the first conductor pattern 2. The thin film layer includes a first insulator 5 on the first conductor pattern 2; a second insulator 10 on the first insulator 5; a second conductor pattern 8 formed on the first insulator 5 in such a manner as to partially pass through the first insulator 5 and to be electrically connected to the first conductor pattern 2; a wiring pattern 9 for circuit correction formed on the first insulator 5; and a third conductor pattern 11 passing through the first insulator 5 and the second insulator 10 and electrically connected to the second conductor pattern 8.

23 Claims, 9 Drawing Sheets

COMPARISON IN DIFFUSION AMOUNT OF Cu INTO POLYIMIDE

CIRCUIT BOARD AND METHOD OF MANUFACTURING THE SAME

TECHNICAL FIELD

The present invention relates to a circuit board and a method of manufacturing the circuit, and particularly to a structure of a thin film circuit formed on a wiring board made from a ceramic or the like and a method of manufacturing the structure.

BACKGROUND ART

With the recent trend toward higher integration and higher performance of ceramic wiring boards for mounting LSIs, it has been attempted to make finer geometries of wirings and to make narrower pitches of via-wirings. As a structure of a typical wiring circuit board of this type, there is known a structure in which a thin film circuit is laminated on a thick film circuit board. A technology to which the above structure pertains is disclosed, for example, in "Microelectronics Packaging Handbook (edited by Rao R. Tummala, Eugene J. Rymaszewski), p.14, published by Nikkei PB Co., Ltd. (March, 1991)".

The above-described prior art, however, has the following three disadvantages:

(1) Upon formation of a thin film circuit on a ceramic board containing wirings, it is necessary to connect conductors on the ceramic board side to the thin film circuit. The number of the connecting points therebetween becomes enormous for a large-sized board having high density wirings, and also, in the ceramic board, the above connecting points may be displaced with a variation at steps of printing wirings to green sheets, laminating the green sheets, and sintering the laminated green sheets. As a result, it is difficult to connect all of the connecting points between the conductors on the ceramic board side and the thin film circuit without any problem.

(2) If the above ceramic board contains defects such as short-circuit and/or disconnection of wirings, the defects must be corrected before connection of the conductors on the ceramic board side to the thin film circuit; however, it is not easy to correct the defects.

(3) In the case where a conducting material such as copper, chromium, or nickel is used in combination with an organic insulating material such as polyimide for forming a thin film circuit on a ceramic board, there occurs a problem that a film made from the organic insulating material such as polyimide may be cracked due to film stress of a film made from the conducting material.

The present inventors have undertaken studies to solve all of the above problems (1) to (3) and to realize a circuit board with a high density and a high reliability and a method of manufacturing the circuit board, and accomplished the present invention.

DISCLOSURE OF INVENTION (1) The present invention solves the first problem regarding connection between conductors on a ceramic board side and a thin film circuit in accordance with the following method:

A ceramic board is manufactured in such a manner that a first conductor exposed from a front surface of the ceramic board has an area being as wide as possible insofar as the first conductor is not brought in contact with any conductor therearound. To ensure the broadest area of the first conductor, it is advantageous that a pattern of the first conductor may be formed into an approximately square shape.

A film made from an insulating material such as polyimide is then formed in such a manner as to have via-holes. Since the via-holes are formed by photolithography, it is possible to ensure a high dimensional accuracy of the via-holes. The first conductor exposed from the front surface of the ceramic board is electrically connected to the thin film circuit through the via-holes. In this way, the first conductor pattern on the ceramic board side is wide in area while the size of the via-hole can be made as small as possible depending on a processing limitation of photolithography. Consequently, each of displacement of the first conductor pattern of the ceramic board and a variation in displacement thereof is allowable to such an extent as to nearly correspond to the area of the first conductor pattern. A conductor material is then deposited over the entire surface by sputtering or vapor-deposition, followed by patterning into a specific shape.

(2) The present invention solves the second problem regarding correction of short-circuit and/or disconnection of wirings caused in the ceramic board in accordance with the following method:

A dummy pattern for correcting a wiring is first provided, in addition to a normal pattern, in the second conductor pattern on the first insulator. A conductance inspection is performed before formation of the thin film circuit to recognize which portion of the first conductor pattern has a defect and which portion of the dummy pattern is to be used for correcting the defect.

A first insulator is formed in such a manner as to have via-holes. In this case, it is required to prevent formation of a via-hole at a position over the defective portion of the first conductor pattern or to bury again a via-hole having been once formed at such a position.

This manner can be achieved by the following three methods. The first method is to use a negative-type photosensitive material for forming the first insulator. In this case, after normal exposure for patterning, additional exposure is partially performed only at the position over the defective portion of the first conductor pattern, to thereby prevent formation of a via-hole in such a position.

The second method is to use a non-photosensitive material as a material for forming the first insulator and to form via-holes using a negative-type resist. In this case, exposure may be performed in the same manner as in the above first method.

The third method is to bury a via-hole having been formed at the position over the defective portion of the first conductor pattern by locally applying on such a position a material identical or similar to that for forming the first insulator. In this case, as a method of initially forming via-holes, there may be used any known method.

Here, it is desirable that the shape of the first conductor pattern can be identified by making somewhat different a shape of a pattern for supplying a power source from a shape of a pattern for transmitting a signal. This is effective to correct a via-hole at a position over a defective portion of the first conductor pattern with less error.

After curing the first insulator, a second conductor is deposited and patterned. For patterning, a negative-type resist may be used. Then, normal exposure is performed. At this time, since a portion of the second conductor pattern located at the position over the defective portion of the first conductor pattern is required to be connected to a wiring pattern for circuit correction formed in the vicinity of the second conductor pattern, only a connection portion therebetween is additionally exposed. Thereafter, the resist is developed, to thereby form a pattern connecting the second conductor pattern to the wiring pattern for circuit correction at the position over the defective portion of the first conductor pattern, in addition to the second conductor pattern as the normal pattern and the wiring pattern for circuit correction. Then, the second conductor is etched, followed by stripping of the resist, to complete a conductor pattern.

In this case, it is desirable that the shape of the second conductor pattern can be identified by making somewhat different a shape of a pattern for supplying a power source from a shape of a pattern for transmitting a signal from the viewpoint of the subsequent inspection and correction. This is effective to perform the subsequent inspection and correction with less error. Then, a second insulator is formed in such a manner as to have via-holes, and a third conductor is patterned, to complete a module board.

(3) The third problem lies in that when copper, chromium or nickel is used as a conductor material forming the above thin film circuit and an organic insulating material such as a normal polyimide is used for forming the above first or second insulator, a film made from the organic insulating material is cracked due to film stress of a film made from the conductor material. Such a problem can be solved, according to the present invention, by use of an insulating material being small in film stress and large in Young's modulus and tensile strength as a material for forming an insulator directly under a film of a conductor made from the above conducting material.

Now, there will be described below preferred examples of the above second and third conductor patterns and also preferred examples of the above first and second insulators.

Either or each of the second conductor pattern and the wiring pattern for circuit correction may be formed of a conductor having a structure in which a copper layer is sandwiched from upper and lower sides by layers made from at least one kind selected from a group consisting of titanium, chromium, molybdenum and tungsten; and the first insulator may be made from a polyimide produced from a polyamic acid obtained by polymerization of at least one kind selected from tetracarboxylic acid dihydride components expressed by a chemical formula 1 and at least one kind selected from diamine compounds expressed by a chemical formula 2.

[chemical formula 1]

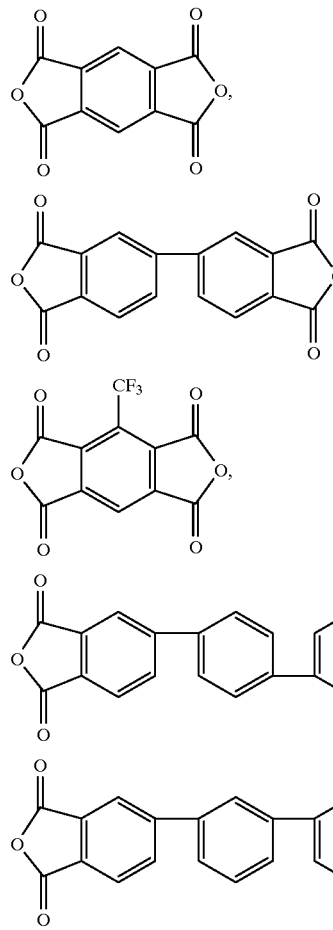

[chemical formula 2]

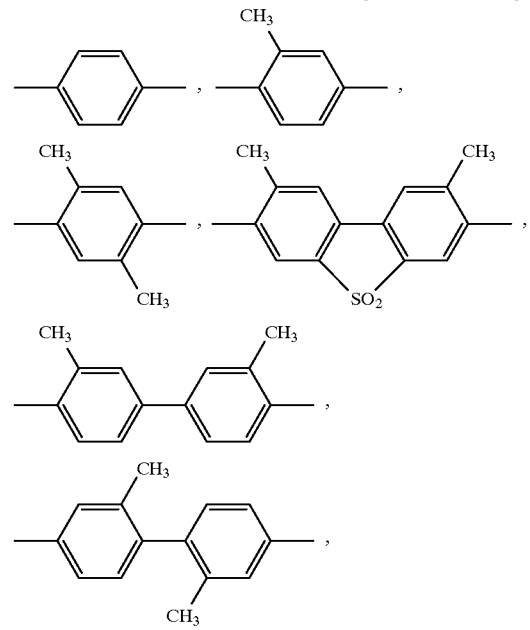

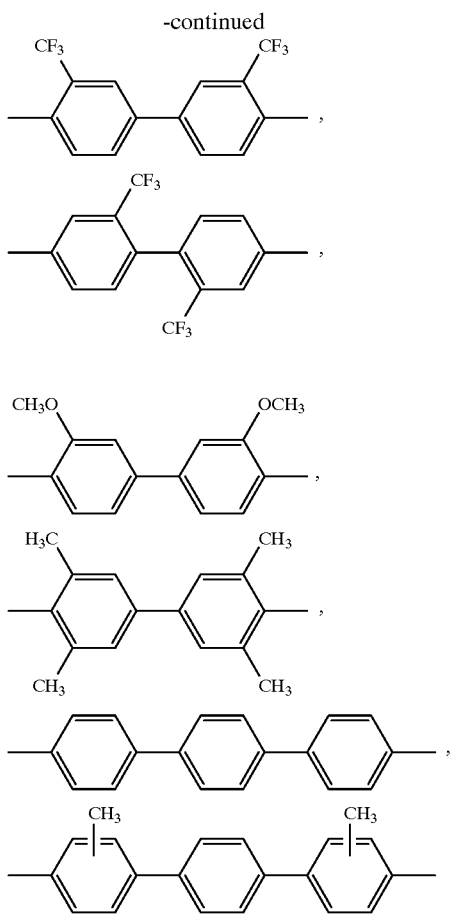

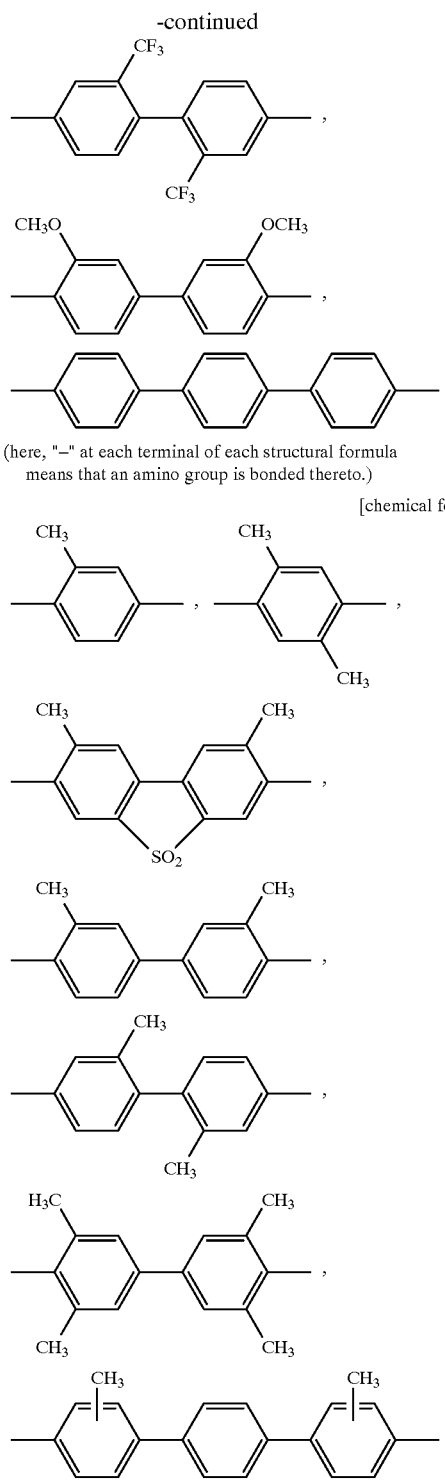

(here, "–" at each terminal of each structural formula means that an amino group is bonded thereto.)

The above first insulator may be made from a polyimide produced from a polyamic acid obtained by polymerization of at least one kind selected from tetracarboxylic acid dihydride components expressed by the chemical formula 1 and a diamine compound; and when the total amount of the diamine compound is taken as 100 mol, the total mol number of at least one kind selected from diamine compounds expressed by a chemical formula 3 may be in a range of 0 to 95 mol and the total mol number of at least one kind selected from diamine compounds expressed by a chemical formula 4 may be in a range of 5 to 100 mol.

[chemical formula 3]

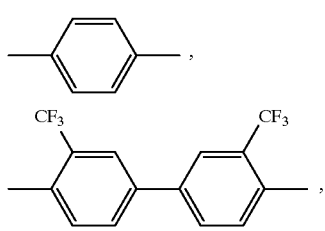

The first insulator may be made from a polyimide produced from a polyamic acid obtained by polymerization of a tertacarboxylic acid dihydride component and a diamine compound; and when the total amount of the tertacaboxylic acid dihydride compound is taken as 100 mol, the total mol number of at least one kind selected from tertacaboxylic acid dihydride compounds expressed by the chemical formula 1 may be in a range of 60 to 100 mol and the total mol number of at least one kind selected from tertacaboxylic acid dihydride compounds expressed by a chemical formula 5 may be in a range of 0 to 40 mol, and when the total amount of the diamine compound is taken as 100 mol, the total mol number of at least one kind selected from diamine compounds expressed by the chemical formula 2 may be in a range of 60 to 95 mol and the total mol number of at least one kind selected from diamine compounds expressed by a chemical formula 6 may be in a range of 5 to 40 mol.

[chemical formula 5]

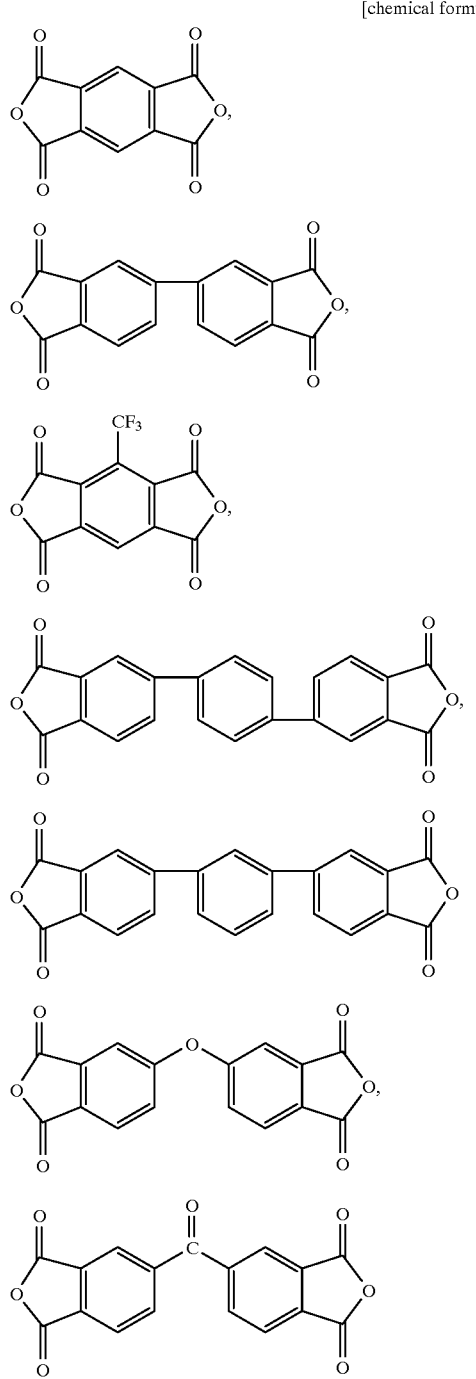

[chemical formula 6]

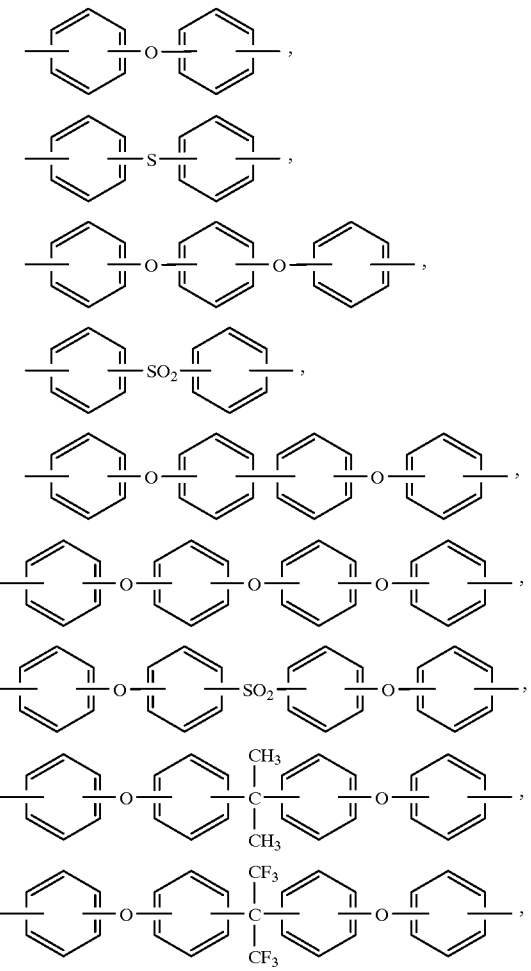

(here, "—" at each terminal of each structural formula means that an amino group is bonded thereto.)

The above third conductor may be formed of a conductor having a structure in which at least a nickel layer is formed on layers made from at least one kind selected from a group consisting of titanium, chromium, molybdenum and tungsten; and the second insulator may be made from a polyimide produced from a polyamic acid obtained by polymerization of at least one kind selected from tetracarboxylic acid dihydride components expressed by the chemical formula 1 and at least one kind selected from diamine compounds expressed by the chemical formula 2.

The above second insulator may be made from a polyimide produced from a polyamic acid obtained by polymerization of at least one kind selected from tetracarboxylic acid dihydride components expressed by the chemical formula 1 and a diamine compound; and when the total amount of the diamine compound is taken as 100 mol, the total mol number of at least one kind selected from diamine compounds expressed by the chemical formula 3 may be in a range of 0 to 95 mol and the total mol number of at least one kind selected from diamine compounds expressed by the chemical formula 4 may be in a range of 5 to 100 mol.

The second insulator may be made from a polyimide produced from a polyamic acid obtained by polymerization of a tertacarboxylic acid dihydride component and a diamine compound; and when the total amount of the tertacaboxylic acid dihydride compound is taken as 100 mol, the total mol number of at least one kind selected from tertacaboxylic acid dihydride compounds expressed by the chemical formula 1 may be in a range of 60 to 100 mol and the total mol number of at least one kind selected from tertacaboxylic acid dihydride compounds expressed by the chemical formula 5 may be in a range of 0 to 40 mol, and when the total amount of the diamine compound is taken as 100 mol, the total mol number of at least one kind selected from diamine compounds expressed by the chemical formula 2 may be in a range of 60 to 95 mol and the total mol number of at least one kind selected from diamine compounds expressed by the chemical formula 6 may be in a range of 5 to 40 mol.

The function of the present invention is as follows:

(1) According to the present invention, when a thin film circuit is formed on a ceramic board containing wirings, a tolerance in connection of conductors on the ceramic board side and the thin film circuit can be made larger. The reason for this is that an area of a conductor pattern on the ceramic board side is made as wide as possible and an area of a portion of the conductor pattern connected to the thin film circuit side is made as small as possible with a high accuracy.

(2) According to the present invention, in the case where there occur short-circuit and/or disconnection in a ceramic board, the short-circuit and/or disconnection can be corrected. The reason for this is to adopt the above-described correcting method. Further, the reason why the correction and inspection can be made with less error is to identify the shape of a pattern formed of a conductor and a thin film circuit by making different a shape of a pattern for supplying a power source from a shape of a pattern for transmitting a signal.

(3) According to the present invention, in the case where a conducting material such as copper, chromium or nickel is used in combination with an organic insulating material such as polyimide for formation of a thin film circuit on a ceramic board, it is possible to prevent a film made from the organic insulating material from being cracked due to film stress of a film made from the conducting material. The reason for this is to use an insulating material small in film stress and large in Young's modulus and tensile strength as a material for forming an insulator directly under the film made from the conducting material.

BEST MODE FOR CARRYING OUT THE INVENTION

Figure 1A:
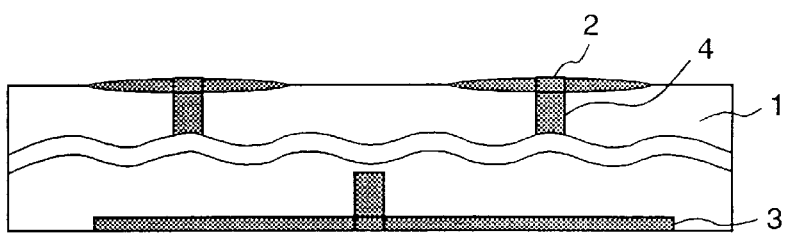
FIGS. 1(a) to 1(f) are sectional views of a structure of a circuit board of the present invention, illustrating one example of a process of manufacturing the circuit board.
Figure 1B:
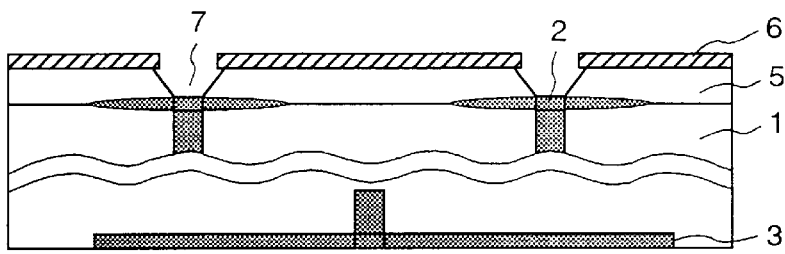

Hereinafter, there will be described in detail a circuit board of the present invention and a method of manufacturing the circuit board by way of examples with reference to the drawings.

Prior to description of examples regarding a circuit board and a method of manufacturing the circuit board, there will be described synthesizing examples 1 to 14 each showing synthesis of an organic insulating material used for manufacturing a thin film layer of a circuit board.

[Synthesizing Example 1]

First, 9.55 g of 3, 3'-dimethyl-4, 4'-diaminobiphenyl and 11.35 g of paraphenylenediamine, as a diamine component, were stirringly dissolved, at room temperature and in flow of nitrogen, into 368.5 g of a mixed solvent of N, N-dimethylacetamide (DMAc) and 1-methyl-2-pyrrolidone (NMP) mixed at a mixing ratio of 1:1.

Next, 44.12 g of 3, 4, 3', 4'-biphenyl tetracarboxylic acid dihydride as an acid dihydride component was mixed and stirringly dissolved in the above solution of the diamine component in flow of nitrogen (nor-volatile content: 15%). After an elapse of 6 hr since addition of the acid dihydride in the solution of the diamine component, the viscosity of a polyimide precursor solution (polyamic acid varnish) reached 60 Pa×s. The resultant solution was further heated at a temperature of 60 to 70° C. for about 6 hr so that the viscosity thereof reached 3.7 Pa×s, to thereby obtain a polyimide precursor used for manufacturing a wiring structure (shown as Varnish No. 1 in Table 1).

[Synthesizing examples 2 to 8]

The same procedure as that in Synthesizing Example 1 was repeated to synthesize other polyimide precursor varnishes, except for use of other diamine components and acid hydride components shown in Table 1. The polyimide precursor varnishes thus obtained were shown as Varnish Nos. 2 to 8 in Table 1 with nor-volatile contents and viscosities thereof.

TABLE 1

Polyimide Precursor Varnish

| varnish No. | acid dihydride component | diamine component | nor-volatile content (%) | viscosity (Pa × s) |
|---|---|---|---|---|
| 1 | BPDA | PDA:DMBP = 7:3 (mol ratio) | 15 | 3.7 |
| 2 | TPDA | PDA | 15 | 4.0 |

TABLE 1-continued

Polyimide Precursor Varnish

| varnish No. | acid dihydride component | diamine component | nor-volatile content (%) | viscosity (Pa × s) |
|---|---|---|---|---|
| 3 | m-TPDA | PDA:DMBP = 7:3 (mol ratio) | 15 | 5.0 |
| 4 | BPDA:ODPA = 2:1 (mol ratio) | PDA:DMBP = 9:1 (mol ratio) | 15 | 4.5 |
| 5 | BPDA | PDA:DDE = 8:2 (mol ratio) | 15 | 6.0 |
| 6 | BPDA | PDA:BAPB = 9:1 (mol ratio) | 15 | 5.0 |
| 7 | TPDA | DATP:BAPP = 6:4 (mol ratio) | 18 | 4.5 |
| 8 | PMDA | DMBP:DDE = 7:3 (mol ratio) | 15 | 5.0 |

[Synthesizing Example 9]

First, 12.01 g of 4, 4'-diaminodiphenyl ether and 9.73 g of paraphenylenediamine, as a diamine component, were stirringly dissolved, at room temperature and in flow of nitrogen, into 373.1 g of a mixed solvent of DMAc and NMP mixed at a mixing ratio of 1:1.

Next, 44.10 g of 3, 4, 3', 4'-biphenyl tetracarboxylic acid dihydride as an acid dihydride component was mixed and stirringly dissolved in the above solution of the diamine component in flow of nitrogen (nor-volatile content: 15%). After an elapse of 6 hr since addition of the acid dihydride component in the solution of the diamine component, the viscosity of a polyimide precursor solution (polyamic acid varnish) reached 70 Pa×s. The resultant solution was further heated at a temperature of 60 to 70° C. for about 6 hr so that the viscosity thereof reached 1.8 Pa×s.

Next, 51.33 g (twice the mount of the acid dihydride in mol number) of MDAP and 3.95 g (6 wt % of nor-volatile content) of BISAZ were added to the above polyamide precursor solution, followed by stirring for 5 hr, so that the viscosity of the solution reached 3.7 Pa×s, to thereby obtain a polyimide precursor used for manufacturing a wiring structure (shown as Varnish No. 9 in Table 2).

TABLE 2

Polyimide Precursor Varnish

| varnish No. | acid dihydride component | diamine component | photosensitive component | nor-volatile content (%) | viscosity (Pa × s) |
|---|---|---|---|---|---|
| 9 | BPDA | PDA:DDE = 6:4 (mol ratio) | MDAP: twice amount of acid dihydride in mol number BISAZ: 6 wt % of nor-volatile content | 15 | 3.7 |
| 10 | PMDA | PDA:DDE = 6:4 (mol ratio) | MDAE: twice amount of acid dihydride in mol number DAZB: 6 wt % of nor-volatile content | 15 | 4.0 |
| 14 | BPDA | DDE | MDAP: twice amount of acid dihydride in mol number BISAZ: 6 wt % of nor-volatile content | 15 | 3.5 |

[Synthesizing Examples 10 and 14]

The same procedure as in Synthesizing Example 9 was repeated except for use of other monomers shown in Table 2, to synthesize Varnish Nos. 10 and 14.

[Synthesizing Examples 11, 12 and 13]

The same procedure as in Synthesizing Example 1 was repeated except for use of monomers shown in Table 3, to synthesize Varnish Nos. 11, 12 and 13.

TABLE 3

Polyimide Precursor Varnish

| varnish No. | acid dihydride component | diamine component | nor-volatile content (%) | viscosity (Pa × s) |
|---|---|---|---|---|
| 11 | PMDA | DDE | 15 | 4.0 |
| 12 | BTDA | DDE | 15 | 3.5 |
| 13 | BPDA | BAPP | 15 | 3.5 |

In addition, the abbreviations of the compounds shown in Tables 1 to 3 are as follows:

PMDA: pyromellitic acid dihydride

BTDA: 3, 4, 3', 4'-benzophenone tetracaboxylic acid dihydride

BPDA: 3, 4, 3', 4'-biphenyl tetracarboxylic acid dihydride

ODPA: 3, 4, 3', 4'-oxydiphthalic acid dihydride

TPDA: p-terphenyl-3, 4, 3", 4"-tetracarboxylic acid dihydride m-TPDA: m-terphenyl-3, 4, 3", 4"-tetracarboxylic acid dihydride DDE: 4, 4'-diaminodiphenyl ether BAPB: 4, 4'-bis (4-aminophenoxy) biphenyl BAPP: 2, 2-bis [4-(4-aminophenoxy) phenyl] propane
PDA: p-phenylenediamine
DMBP: 3, 3'-dimethyl-4, 4'-diaminobiphenyl
DATP: 4, 4"-diamino-p-terphenyl
MDAP: dimethylaminopropyl methacrylate
MDAE: dimethylaminoethyl methacrylate
BISAZ: bis (4-azidobenzal)-4-carboxycyclohexanone
DAZB: 3, 3'-dimethoxy-4, 4'-diazidobiphenyl
APMS: 3-aminopropyl trimethoxysilane
APES: 3-aminopropyl triethoxysilane <Example 1>

A process of manufacturing a circuit board carried out in this example will be described in accordance with a flow chart shown in FIGS. 1(a) to 1(f).

A glass based ceramic board 1 (size: 150 mm×150 mm, thickness: 4.5 mm) was first prepared. The glass board 1 has on its front and back surfaces thick film conductors 2 and 3 (as a first conductor pattern) made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 1(a)].

Varnish No. 1 shown in Table 1 was applied on the ceramic board 1 by spin-coating and was pre-baked on the hot plate at 140° C. for 20 min, to form an insulator 5 (as a first insulator). A negative type resist as a resist 6 was applied thereon, followed by pre-baking on the hot plate at 110° C. for 7 min, and exposed and developed. The resist 6 was then subjected to ashing for 3 min and exposed to a solution of tetramethyl ammonium hydroxide (concentration: 2.4 wt %), to form via-holes 7 [see FIG. 1(b)].

Figure 1C:
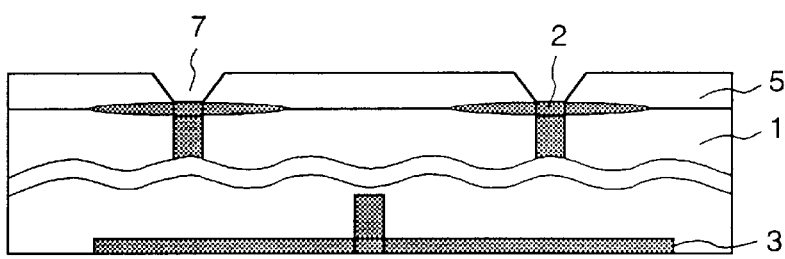

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulator 5 [see FIG. 1(c)].

Figure 1D:
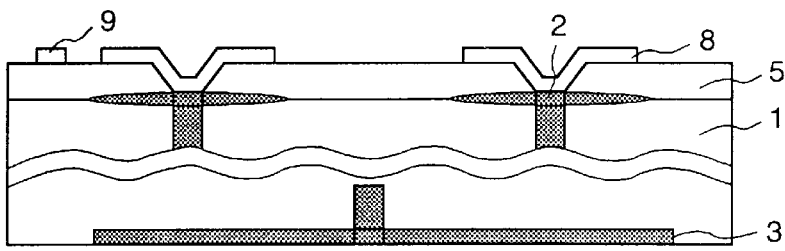

Next, chromium, copper and chromium as conductors were sputtered in this order on the insulator 5, and patterned using a negative resist to form a conductor pattern 8 (as a second conductor pattern) and a circuit correcting wiring 9, followed by stripping of the resist [see FIG. 1(d)].

The board 1 was dried on the hot plate at 140° C. for 30 min, followed by ashing for 3 min. Varnish No. 1 shown in Table 1 was then applied by spin-coating, followed by pre-baking on the hot plate at 140° C. for 20 min. A negative type resist was applied thereon, followed by pre-baking on the hot plate at 110° C. for 7 min, and exposed and developed. The resist was subjected to ashing for 3 min and exposed to a solution of tetramethyl ammonium hydroxide concentration: 2.4 wt %), to form via-holes. After stripping of the resist 6, the board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus form an insulator 10 as a second insulator [see FIG. 1(e)].

Figure 1E:
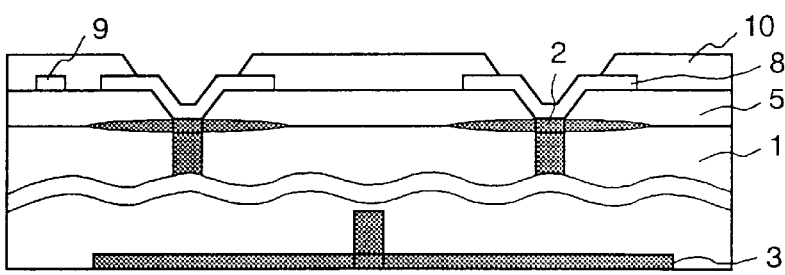
Figure 1F:
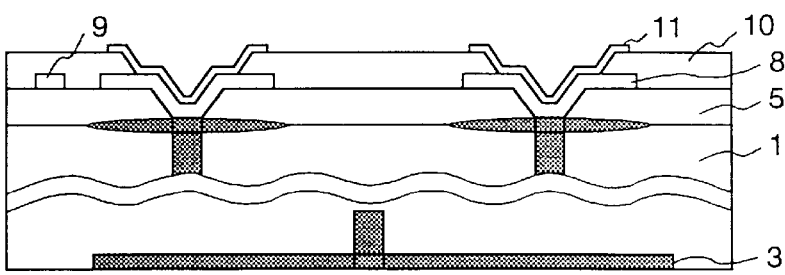

Next, a chromium based alloy and a nickel based alloy were sequentially sputtered on the insulator 10, and patterned using a negative resist to form a conductor pattern 11 (as a third conductor pattern), followed by stripping of the resist [see FIG. 1(f)].

The board 1 was then subjected to annealing using hydrogen gas at 350° C. for 30 min, followed by gold plating on the conductor pattern 11, to thus complete a module board. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

Figure 2:
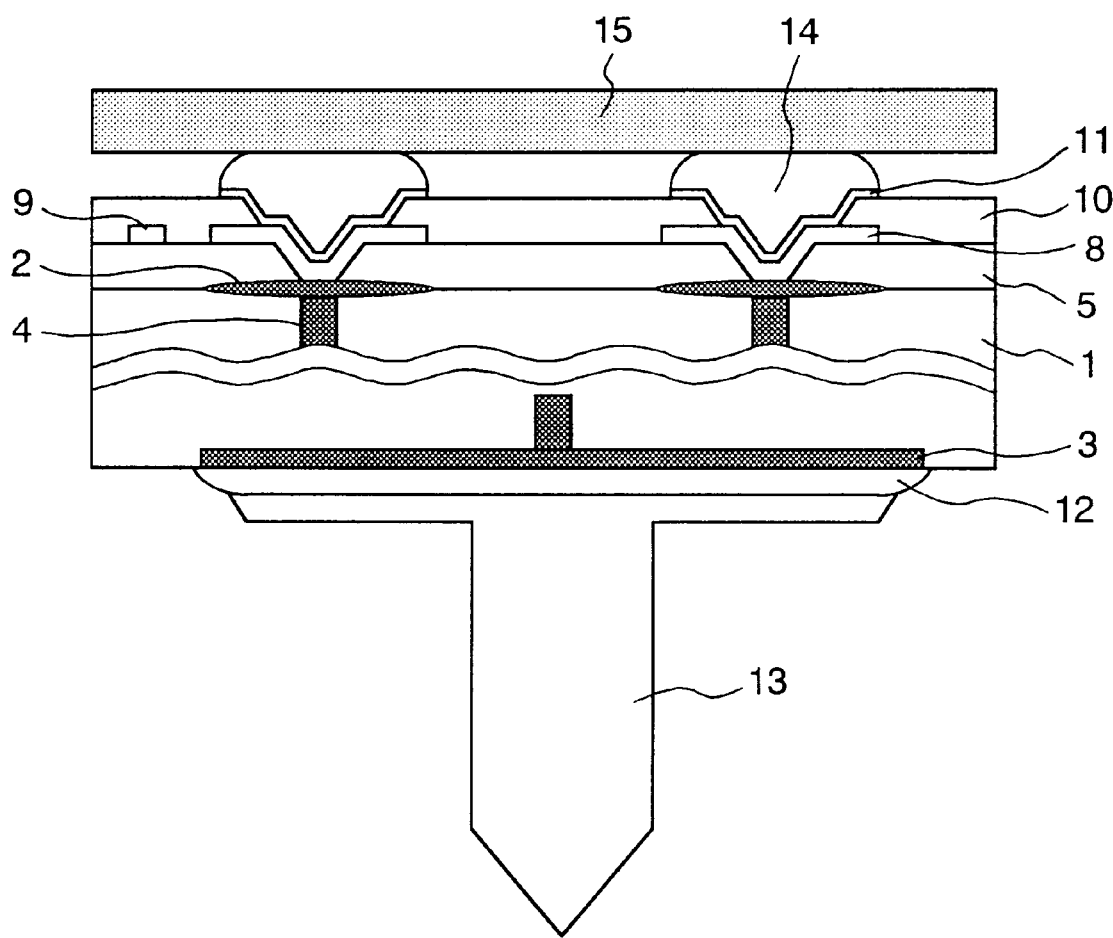
FIG. 2 is a sectional view showing one example of a multi-chip module manufactured in accordance with the present invention.

An input/output pin 13 was erected on the back side of the module board thus obtained through solder 12, and an LSI 15 was connected on the front side of the module board through solder 14, to complete a multi-chip module shown in FIG. 2. Any failure such as crack or stripping was not observed in the multi-chip module thus obtained, and all of the wirings exhibited good electric conductance and good operational characteristics.

<Examples 2 to 8>

The same procedure as that in Example 1 was repeated except that Varnish Nos. 2 to 8 were used for each of the insulators 5 and 10 in Example 1, to complete other module boards. Each of the module boards thus obtained was subjected to inspection. As a result, any cracking and/or stripping were not observed in the conductor pattern 8, correcting wiring pattern 9, conductor pattern 11, neighborhoods thereof, and lower layers thereof, and all of the wirings exhibited good electric conduction. Further, multi-chip modules each having the structure shown in FIG. 2 were obtained using the above module boards in the same manner as in Example 1. Any failure such as cracking or stripping was not observed in each of the multi-chip modules thus obtained, and all of the wirings exhibited good electric conductance and good operational characteristics.

<Example 9>

A process of manufacturing a circuit board carried out in this example will be described in accordance with a flow chart shown in FIGS. 3(a) to 3(f).

A glass based ceramic board 1 (size: 150 mm×150 mm, thickness: 4.5 mm) was first prepared. The glass board 1 has on its front and back surfaces thick film conductors 2 and 3 (as a first conductor pattern) made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min see FIG. 3[a)].

Varnish No. 1 shown in Table 1 was applied on the ceramic board 1 by spin-coating and was pre-baked on the hot plate at 140° C. for 20 min, to form an insulator 5 (as a first insulator). A negative type resist as a resist 6 was applied thereon, followed by pre-baking on the hot plate at 110° C. for 7 min, and exposed using a specific mask. Here, it is assumed that a wiring under a conductor pattern 16 is disconnected and is previously checked by a conduction test. Accordingly, it is necessary to prevent formation of a via-hole over the conductor pattern 16. For this purpose, only a portion of the resist 6 positioned over the conductor pattern 16 was further locally exposed. The resist was then developed, being subjected to ashing for 3 min, and was exposed to a solution of tetramethyl ammonium hydroxide (concentration: 2.4 wt %), to form a via-hole 7 on the conductor 2 [see FIG. 3(b)].

Figure 3A:
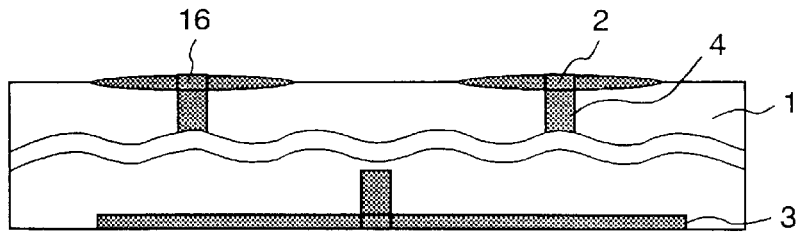
FIGS. 3(a) to 3(f) are sectional views of a structure of a circuit board of the present invention, illustrating a process of manufacturing the circuit board.
Figure 3B:
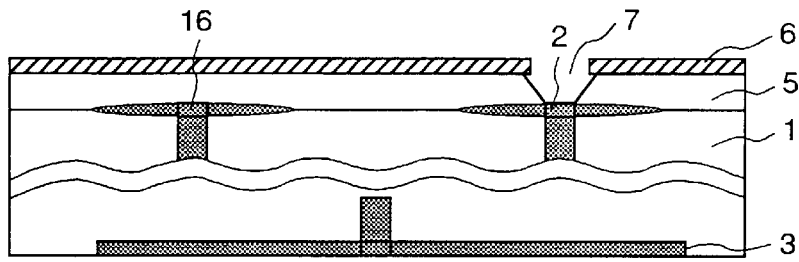
Figure 3C:
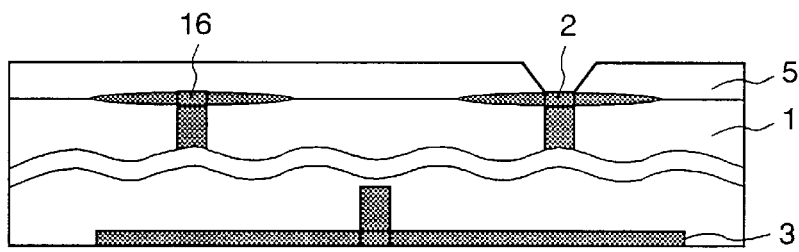

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulator 5 [see FIG. 3(c)].

Chromium, copper and chromium as conductors were sputtered in this order on the insulator 5. Then, a negative-type resist was formed thereon, followed by exposure using a specific mask to form a conductor pattern 8 (as a second conductor pattern) and a circuit correcting wiring 9, and further locally exposed so as to connect the conductor pattern 8 to the circuit correcting wiring 9. The resist was then developed, followed by ashing for 3 min. Then, chromium, copper and chromium as conductors were etched, followed by stripping of the resist [see FIG. 3(d)].

Figure 4:
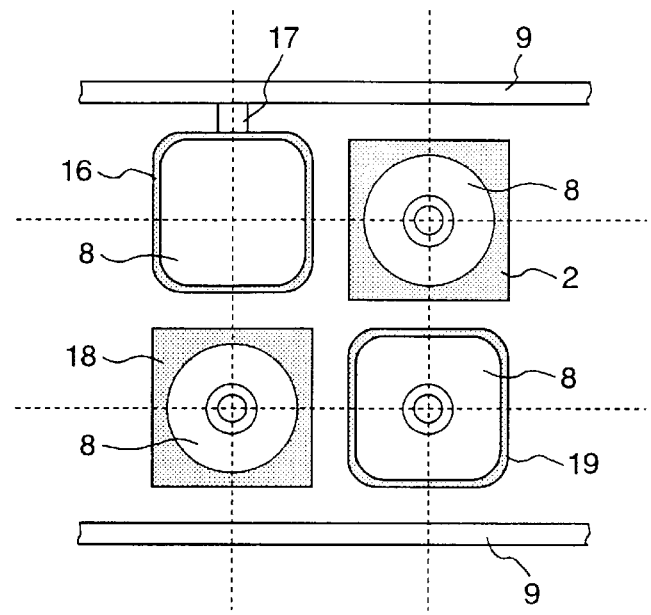
FIG. 4 is a plan view showing a shape of a conductor pattern of a circuit board of the present invention and a state in which a wiring is corrected.

Such a state viewed from the upper surface of the board is shown by a plan view of FIG. 4. A portion (as a fourth conductor pattern) at which the conductor pattern 8 is connected to the circuit correcting wiring 9 is indicated by reference numeral 17. A correcting conductor pattern is connected to a leading end of the correcting wiring 9 connected to the conductor pattern 8 by the portion 17, thereby correcting a defect of the ceramic board. While the conductor pattern 8, the circuit correcting wiring 9, and the connecting portion 17 as the fourth conductor pattern are formed on the surface of the insulator 5, the underlaying thick film conductor patterns 2, 16, and 16' are viewed in FIG. 4 because the insulator 5 is transparent. In addition, the portion 16' in FIG. 4 is connected to the conductor pattern 8 (as the second conductor pattern) through the via-hole 7 because a wiring under the portion 16' has no defect.

The board 1 was dried on the hot plate at 140° C. for 30 min, followed by ashing for 3 min. Varnish No. 1 in Table 1 was then applied by spin-coating, followed by pre-baking on the hot plate at 140° C. for 20 min. A negative type resist was applied thereon, followed by pre-baking on the hot plate at 110° C. for 7 min, and was exposed and developed. The resist was subjected to ashing for 3 min and exposed to a solution of tetramethyl ammonium hydroxide (concentration: 2.4 wt %), to form via-holes. After stripping of the resist 6, the board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus form an insulator 10 as a second insulator [see FIG. 3(e)].

Figure 3D:
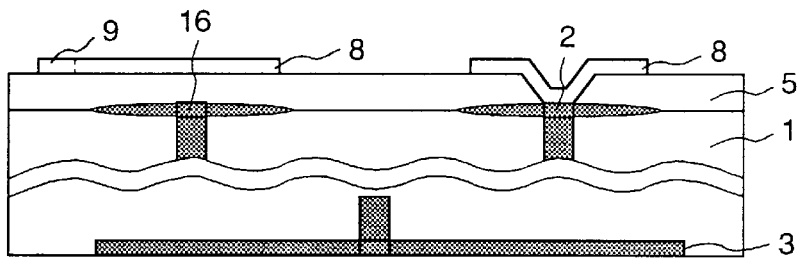
Figure 3E:
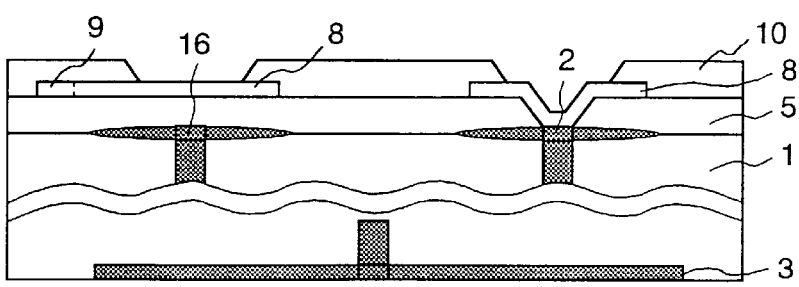
Figure 3F:
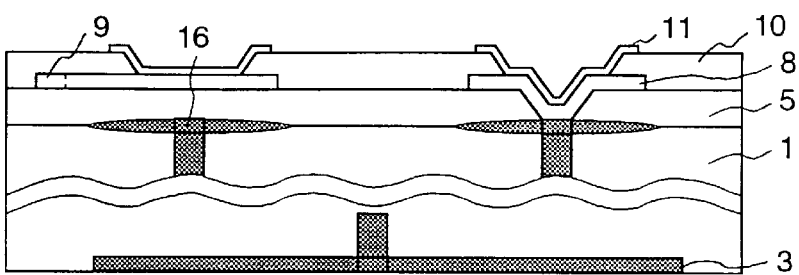

Next, a chromium based alloy and a nickel based alloy were sequentially sputtered on the insulator 10, and patterned using a negative resist to form a conductor pattern 11 (as a third conductor pattern), followed by stripping of the resist [see FIG. 3(f)].

The board 1 was then subjected to annealing using hydrogen gas at 350° C. for 30 min, followed by gold plating on the conductor pattern 11, to thus complete a module board. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

Figure 5:
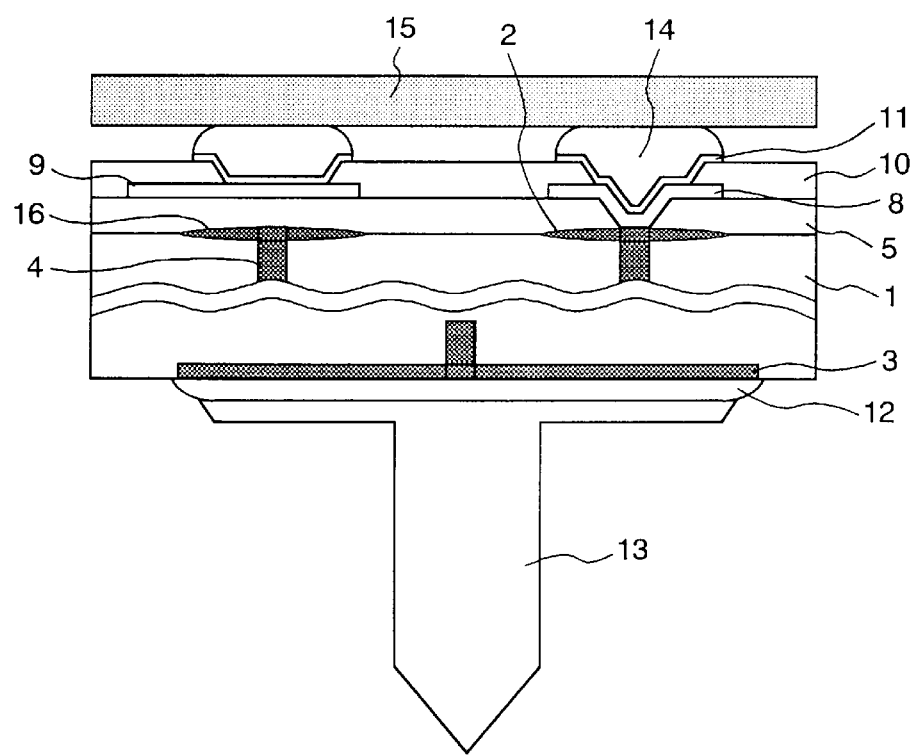
FIG. 5 is a sectional view showing one example of a multi-chip module manufactured in accordance with the present invention.

An input/output pin 13 was erected on the back side of the module board thus obtained through solder 12, and an LSI 15 was connected on the front side of the module board through solder 14, to complete a multi-chip module shown in FIG. 5. Any failure such as cracking or stripping was not observed in the multi-chip module thus obtained, and all of the wirings exhibited good electric conductance and good operational characteristics.

<Examples 10 to 16>

The same procedure as that in Example 9 was repeated except that each of Varnish Nos. 2 to 8 in Table 1 was used as the polyimide precursor varnish in Example 9, to complete other module boards. In this example, like Example 9, a ceramic board has a defect in a wiring. Each of the module boards thus obtained was subjected to inspection. As a result, any cracking and/or stripping were not observed in the conductor pattern 8, correcting wiring pattern 9, conductor pattern 11, neighborhoods thereof, and lower layers thereof, and all of the wirings exhibited good electric conduction. Further, multi-chip modules each having the structure shown in FIG. 5 were obtained using the above module boards in the same manner as in Example 9. Any failure such as cracking or stripping was not observed in each of the multi-chip modules thus obtained, and all of the wirings exhibited good electric conductance and good operational characteristics.

<Example 17>

Figure 6A:
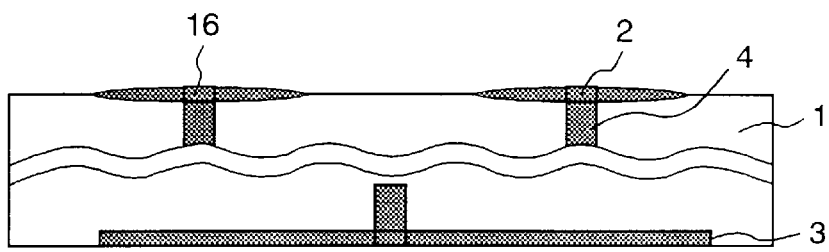
FIGS. 6(a) to 6(c) are sectional views of a structure of a circuit board of the present invention, illustrating a process of manufacturing the circuit board.
Figure 6B:
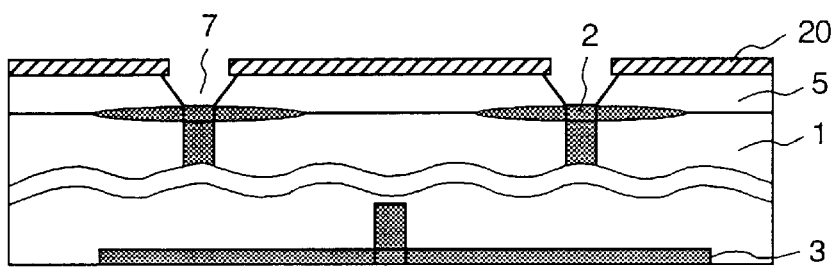
Figure 6C:
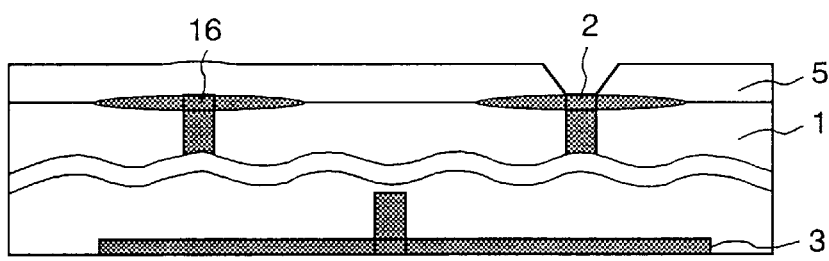

A process of manufacturing a circuit board carried out in this example will be briefly described in accordance with a flow chart shown in FIGS. 6(a) to 6(c).

A glass based ceramic board 1 (size: 150 mm×150 mm, thickness: 4.5 mm) was first prepared. The glass board 1 has on its front and back surfaces thick film conductors 2 and 3 made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 6(a)].

Varnish No. 1 shown in Table 1 was applied on the ceramic board 1 by spin-coating and was then pre-baked on the hot plate at 140° C. for 20 min, to form an insulator 5. A negative type resist as a resist 20 was applied thereon, followed by pre-baking on the hot plate at 110° C. for 7 min, and then exposed using a specific mask and was developed. The resist was then subjected to ashing for 3 min, and was exposed to a solution of tetramethyl ammonium hydroxide (concentration: 2.4 wt %), to form via-holes 7 [see FIG. 6(b)].

Next, the resist 6 was stripped. Here, it is assumed that a wiring under a conductor pattern 16 is disconnected and is previously checked by a conduction test. Accordingly, it is necessary to prevent formation of a via-hole over the conductor pattern 16. For this purpose, Varnish No. 1 in Table 1 was locally applied only to a portion over the conductor pattern 16. Then, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulator 5 [see FIG. 6(c)].

Thereafter, the same steps as those in Example 9 [see FIGS. 3(d) to 3(f)] were repeated, and further a module board was completed in accordance with the same manner as in Example 9. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 5. Any failure such as cracking or stripping was not observed in the multi-chip module thus obtained, and all of the wirings exhibited good electric conductance and good operational characteristics.

<Example 18>

A process of manufacturing a circuit board carried out in this example will be briefly described in accordance with the flow chart shown in FIGS. 6(a) to 6(c).

A glass based ceramic board 1 (size: 150 mm×150 mm, thickness: 4.5 mm) was first prepared. The glass board 1 has on its front and back surfaces thick film conductors 2 and 3 made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 6(a)].

Varnish No. 1 shown in Table 1 was applied on the ceramic board 1 by spin-coating and was then pre-baked on the hot plate at 140° C. for 20 min, to form an insulator 5. A negative type resist as a resist 20 was applied thereon, followed by pre-baking on the hot plate at 110° C. for 6 min, and then exposed using a specific mask. Next, the resist was exposed to a solution of tetramethyl ammonium hydroxide (concentration: 2.4 wt %), to develop the resist 20 simultaneously with formation of via-holes 7 in the insulator 5 [see FIG. 6(b)].

Next, the resist 20 was stripped. Here, it is assumed that a wiring under a conductor pattern 16 is disconnected and is previously checked by a conduction test. Accordingly, it is necessary to prevent formation of a via-hole over the conductor pattern 16. For this purpose, Varnish No. 1 in Table 1 was locally applied only to a portion over the conductor pattern 16. Then, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulator 5 [see FIG. 6(c)].

Thereafter, the same steps as those in Example 9 [see FIGS. 3(d) to 3(f)] were repeated, and further a module board was completed in accordance with the same manner as in Example 9. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 5. Any failure such as cracking or stripping was not observed in the multi-chip module thus obtained, and all of the wirings exhibited good electric conductance and good operational characteristics.

<Examples 19 to 25>

The same procedure as that in Example 18 was repeated except that each of Varnish Nos. 2 to 8 in Table 1 was used as the polyimide precursor varnish in Example 18, to complete other module boards. In this example, like Example 18, a ceramic board has a defect in a wiring.

Each of the module boards thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction. Further, multi-chip modules each having the structure shown in FIG. 5 were obtained using the above module boards in the same manner as in Example 18. Any failure such as cracking or stripping was not observed in each of the multi-chip modules thus obtained, and all of the wirings exhibited good electric conductance and good operational characteristics.

<Example 26>

A process of manufacturing a circuit board carried out in this example will be described in accordance with the flow chart shown in FIGS. 7(a) to 7(e).

A glass based ceramic board 1 (size: 150 mm×150 mm, thickness: 4.5 mm) was first prepared. The glass board 1 has on its front and back surfaces thick film conductors 2 and 3 made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 7(a)].

Here, an insulator 5 having a double layer structure was formed. First, Varnish No. 9 shown in Table 2 was applied on the ceramic board 1 by spin-coating and was then pre-baked on the hot plate at 140° C. for 20 min, to form a first insulator 21. Then, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulator 21. The thickness of the insulator 21 was 1.0 μm [see FIG. 7(b)].

Varnish No. 1 was then applied on the insulator 21 by spin-coating, followed by pre-baking on a hot plate at 140° C. for 20 min. A negative resist as a resist 6 was applied, followed by pre-baking on a hot plate at 110° C. for 7 min and exposed and developed. The resist was then subjected to ashing for 3 min, and exposed to a solution of tetramethyl ammonium hydroxide (concentration: 2.4 wt %), to form via-holes 7 [see FIG. 7(c)].

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure an insulator 22. The thickness of the insulator 22 was 7 μm [see FIG. 7(d)].

Figure 7A:
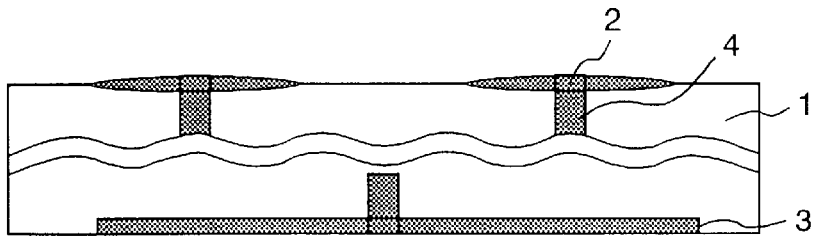
FIGS. 7(a) to 7(e) are sectional views of a structure of a circuit board of the present invention, illustrating a process of manufacturing the circuit board.
Figure 7B:
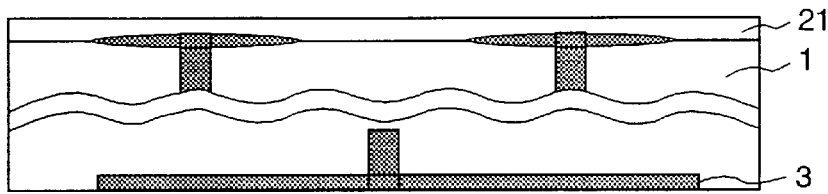
Figure 7C:
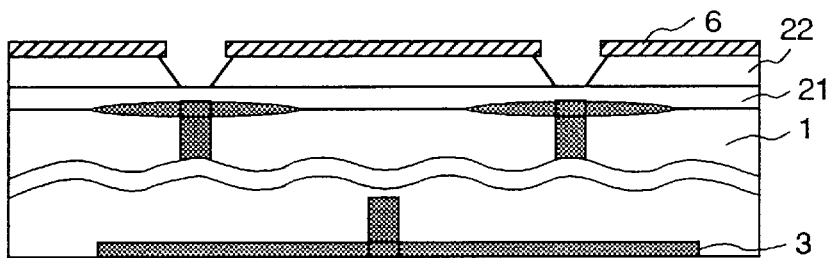
Figure 7D:
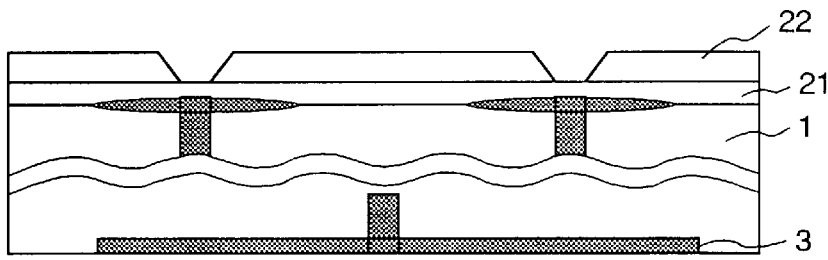
Figure 7E:
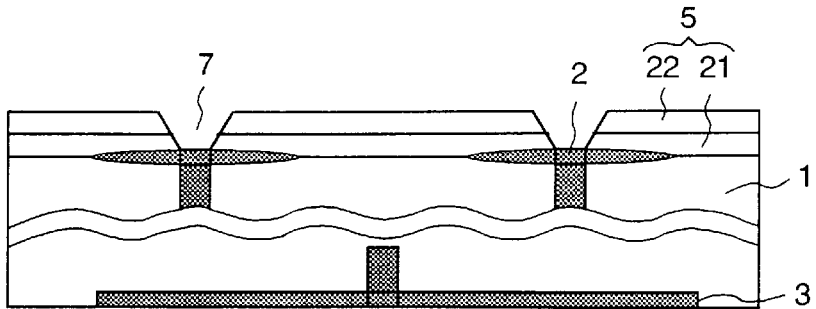

Next, the insulators 21 and 22 are partially removed by ashing to expose a conductor pattern 2, thus completing the via-holes 7 [see FIG. 7(e)].

Thereafter, the same steps as those in Example 1 [see FIGS. 1(d) to 1(f)] were repeated, and further a module board was completed in accordance with the same manner as in Example 1. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 2. Any failure such as cracking or stripping was not observed in the multi-chip module thus obtained, and all of the wirings exhibited good electric conductance and good operational characteristics.

<Examples 27 and 28>

The same procedure as that in Example 26 was repeated except that each of Varnish Nos. 10 and 14 in Table 2 was used for forming the first insulator 21 of the insulator 5 in Example 26, to complete other module boards. Each of the module boards thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 2. Any failure such as cracking or stripping was not observed in the multi-chip module thus obtained, and all of the wirings exhibited good electric conductance and good operational characteristics.

<Example 29>

A process of manufacturing a circuit board carried out in this example will be described in accordance with the flow chart shown in FIGS. 8(a) to 8(e).

A glass based ceramic board 1 (size: 150 mm×150 mm, thickness: 4.5 mm) was first prepared. The glass board 1 has on its front and back surfaces thick film conductors 2 and 3 made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 8(a)].

Here, an insulator 5 having a double layer structure was formed. Varnish No. 1 shown in Table 1 was applied on the ceramic board 1 by spin-coating to a thickness equivalent to 3 μm after baking up to 350° C. and was pre-baked on the hot plate at 140° C. for 20 min, to form a first insulator 21. A negative resist as a resist 6 was then applied, followed by pre-baking on a hot plate at 110° C. for 7 min and exposed and developed. The resist was then subjected to ashing for 3 min, and exposed to a solution of tetramethyl ammonium hydroxide (concentration: 2.4 wt %), to form via-holes [see FIG. 8(b)].

Figure 8A:
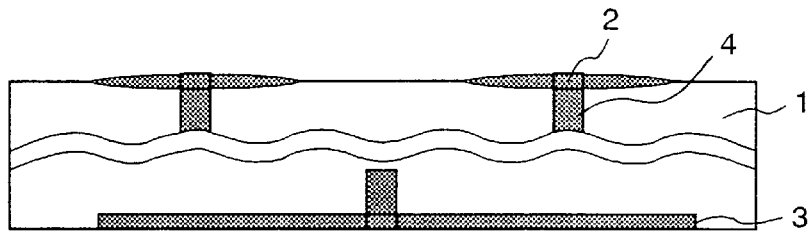
FIGS. 8(a) to 8(e) are sectional views of a structure of a circuit board of the present invention, illustrating a process of manufacturing the circuit board.
Figure 8B:
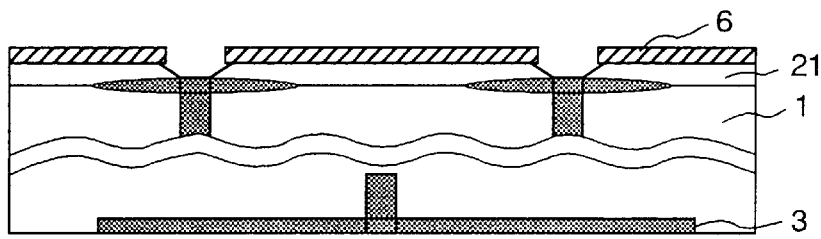
Figure 8C:
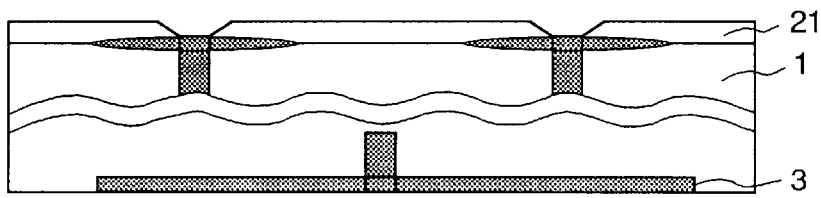
Figure 8D:
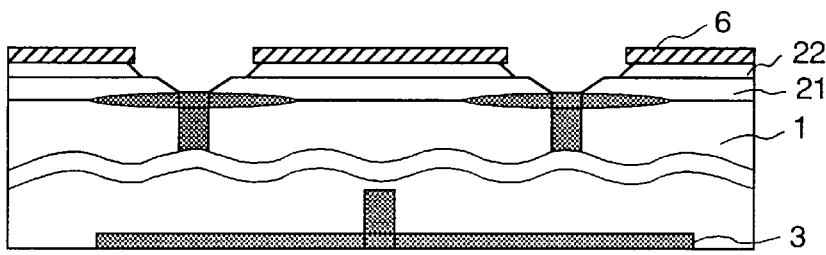
Figure 8E:
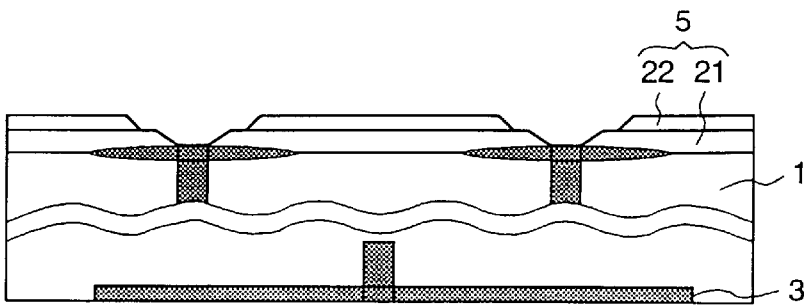

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; and cooled [see FIG. 8(c)].

After ashing for 3 min, Varnish No. 1 in Table 1 was applied on the insulator 21 by spin-coating to a thickness equivalent to 3 Am after baking up to 350° C., followed by pre-baking on the hot plate at 140° C. for 20 min, to form an insulator 22. A negative resist as a resist 6 was applied, followed by pre-baking on the hot plate at 110° C. for 7 min and exposed and developed. The resist was then subjected to ashing for 3 min, and exposed to a solution of tetramethyl ammonium hydroxide (concentration: 2.4 wt %), to form the via-holes [see FIG. 8(d)].

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulators 21 and 22. The insulators 21 and 22 constitutes the insulator 5 [see FIG. 8(c)].

Thereafter, the same steps as those in Example 1 [see FIGS. 1(d) to 1(f)] were repeated, and further a module board was completed in accordance with the same manner as in Example 1. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 2. Any failure such as cracking or stripping was not observed in the multi-chip module thus obtained, and all of the wirings exhibited good electric conductance and good operational characteristics.

<Example 30>

A process of manufacturing a circuit board carried out in this example will be described in accordance with the flow chart shown in FIGS. 8(a) to 8(e).

A glass based ceramic board 1 (size: 150 mm×150 mm, thickness: 4.5 mm) was first prepared. The glass board 1 has on its front and back surfaces thick film conductors 2 and 3 made from copper and it also contains a copper wiring 4. A solution containing 0.5 vol % of APMS (using as a solvent a mixed solution containing 95 vol % of 2-propanol and 5 vol % of water) was applied on the ceramic board 1 by spin-coating, and was dried on a hot plate at 110° C. for 15 min [see FIG. 8(*a*)].

Here, an insulator 5 having a double layer structure was formed. Varnish No. 14 shown in Table 2 was applied on the ceramic board 1 by spin-coating to a thickness equivalent to 2 μm after baking up to 350° C. and was pre-baked on the hot plate at 110° C. for 15 min, to form a first insulator 21. The resist 6 was then formed thereon, followed by exposure using a specific mask, and developed using a mixed solution of 1-methyl-2-prrolidone and water at a mixing ratio (in volume) of 1:1, to form via-holes [see FIG. 8(*b*)].

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; and cooled [see FIG. 8(*c*)].

After ashing for 3 min, Varnish No. 1 in Table 1 was applied on the insulator 21 by spin-coating to a thickness equivalent to 6 μm after baking up to 350° C., followed by pre-baking on the hot plate at 140° C. for 20 min, to form an insulator 22. A negative resist as a resist 6 was applied, followed by pre-baking on the hot plate at 110° C. for 7 min and exposed and developed. The resist was then subjected to ashing for 3 min, and exposed to a solution of tetramethyl ammonium hydroxide (concentration: 2.4 wt %), to complete the via-holes [see FIG. 8(*d*)].

After stripping of the resist 6, the ceramic board 1 was heat-treated in flow of nitrogen under such a heat-cycle that the board 1 was kept at 140° C. for 30 min; heated at a temperature rising rate of 4° C./min; kept at 200° C. for 60 min; heated at a temperature rising rate of 4° C./min; kept at 350° C. for 60 min; and cooled, to thus cure the insulators 21 and 22. The insulators 21 and 22 constitutes the insulator 5 [see FIG. 8(*e*)].

Thereafter, the same steps as those in Example 1 [see FIGS. 1(*d*) to 1(*f*)] were repeated, and further a module board was completed in accordance with the same manner as in Example 1. The module board thus obtained was subjected to inspection. As a result, any cracking and/or stripping were not observed in the conductor pattern 8, correcting wiring 9, conductor pattern 11, neighborhoods thereof, and lower layers thereof, and all of the wirings exhibited good electric conduction.

An input/output pin 13 was erected on the back side of the module board thus obtained through solder 12, and an LSI 15 was connected on the front side of the module board through solder 14, to complete a multi-chip module shown in FIG. 2. Any failure such as cracking or stripping was not observed in the multi-chip module thus obtained, and all of the wirings exhibited good electric conductance and good operational characteristics.

<Example 31>

In this example, a thin film layer of the present invention is formed on a glass based ceramic board with no defect in a wiring.

A process of manufacturing a wiring structure carried out in this example will be described with reference to FIGS. 9(*a*) to 9(*c*). First, the same steps shown in Example 26 with reference to FIGS. 7(*a*) to 7(*e*) are repeated to form a structure shown in FIG. 9(*a*).

Figure 9A:
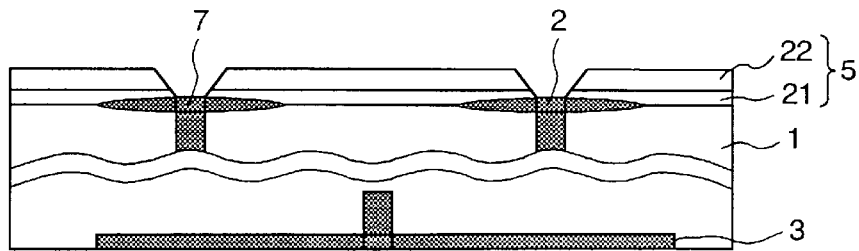
FIGS. 9(a) to 9(c) are sectional views of a structure of a circuit board of the present invention, illustrating a process of manufacturing the circuit board.
Figure 9B:
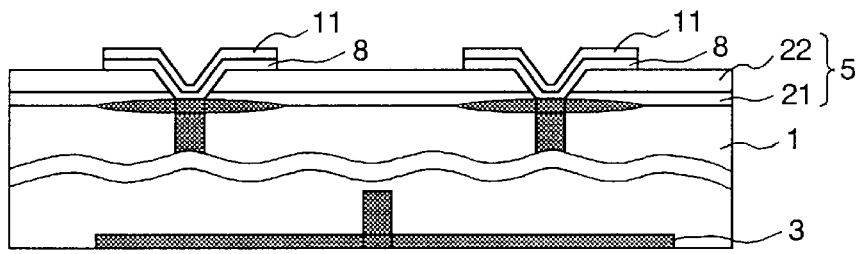
Figure 9C:
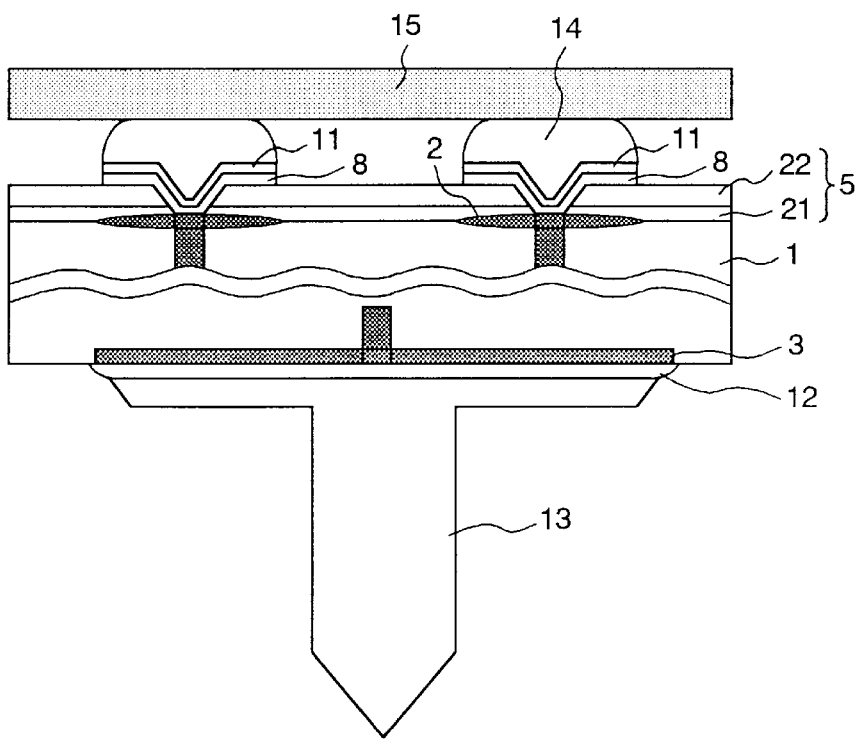

Next, a chromium based alloy, a copper based alloy, a chromium based alloy, and a nickel based alloy were sequentially sputtered and patterned using a negative type pattern, followed by stripping of the resist, to form a laminated film having patterns 8 and 11 [see FIG. 9(*b*)].

Next, gold plating was applied on the pattern 11, to complete a module board. Then, an input/output pin 13 was erected on the back side of the module board thus obtained through solder 12, and an LSI 15 was connected on the front side of the module board through solder 14, to complete a multi-chip module shown in FIG. 7(*c*). Any failure such as cracking or stripping was not observed in the multi-chip module thus obtained, and all of the wirings exhibited good electric conductance and good operational characteristics.

<Example 32>

According to this invention, aminosilane is applied on the glass based ceramic board. This is effective not only to improve adhesiveness between the ceramic board and polyimide but also to prevent reaction of copper exposed from the surface of the ceramic board with polyimide for improving a reliability of an interface between copper and polyimide. Such an effect will be more fully described in this example.

Two boards were prepared, on each of which a chromium film and a copper film were formed by sputtering. Varnish No. 1 (Table 1) was directly applied on one board, and baked in flow of nitrogen at 140° for 60 min, 200° for 60 min, and 350° for 60 min, to thus obtain a sample not treated by APES. Besides, a 2-propanol solution concentration: 0.5%) was applied on the other board, followed by drying at 110° for 15 min, and Varnish No. 1 (Table 1) was applied on the board, and baked in flow of nitrogen at 140° for 60 min, 200° for 60 min, and 350° for 60 min, to thus obtain a sample treated by APES.

Figure 10:
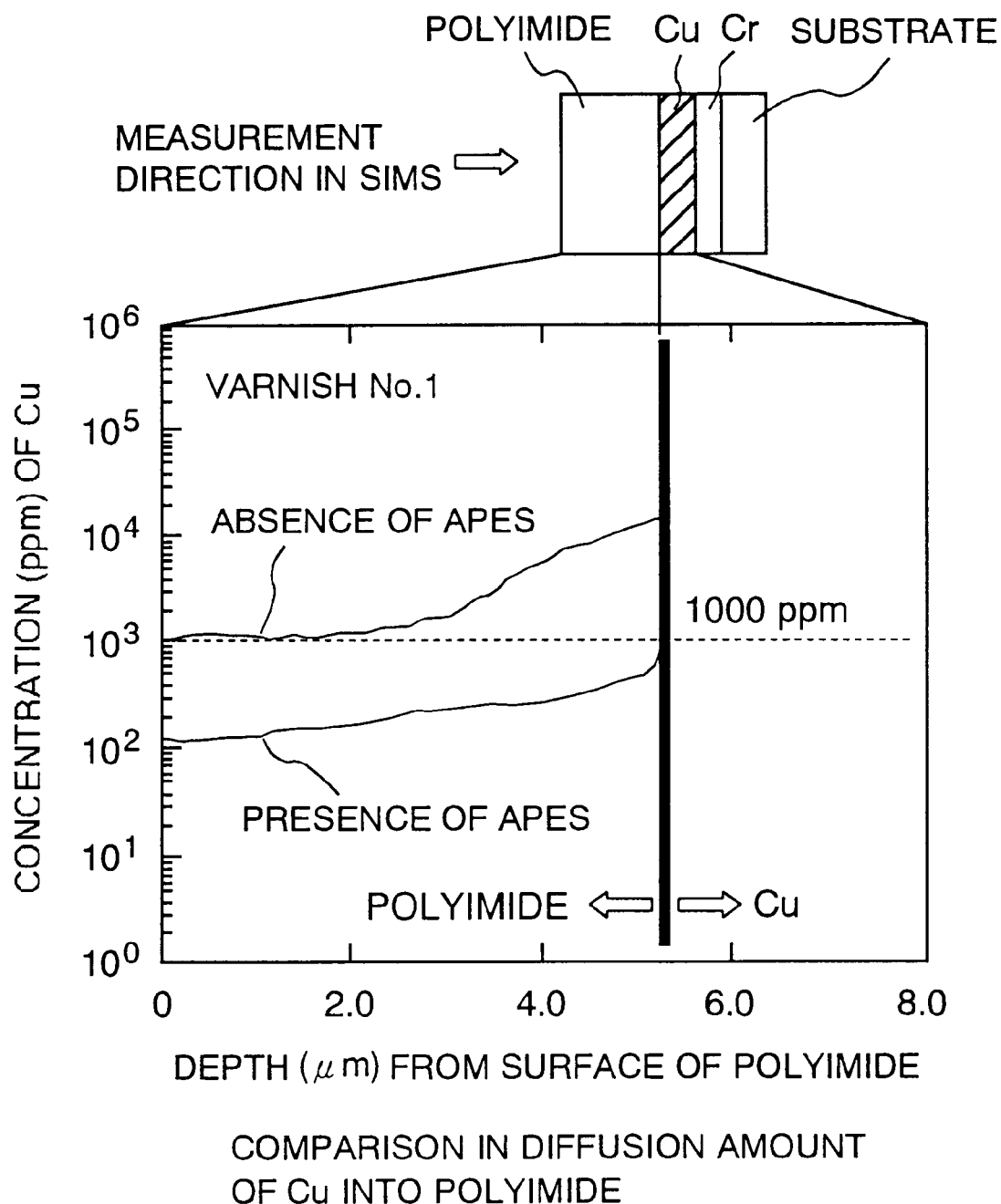
FIG. 10 is a characteristic diagram showing effects of the present invention.

The amount of copper eluted and diffused in polyimide for each sample was determined by SIM (Secondary Ion Mass Spectrometry). The results were shown in FIG. 10. From this graph, it was confirmed that reaction of copper with polyimide was suppressed by applying aminosilane on copper.

<Comparative Examples 1 to 3>

The same procedure as Example 1 was repeated except for use of Varnish Nos. 11, 12, and 13 in Table 3 as the polyimide precursor varnish forming the insulator 5 in Example 1, to manufacture module boards.

In the midway of the manufacturing step, the conductors of chromium, copper, and chromium were patterned to form a conductor pattern 8, and the resist was stripped using a stripping solution [see FIG. 1(*d*)]. At this time, it was confirmed that the insulator 5 under the conductor pattern 8 was cracked at a portion under an end portion of the conductor pattern 5, and that the lower conductor pattern 2 was partially etched and the insulator 5 was floated from the conductor pattern 2 at the cracked portion.

Eventually, it failed to complete any module board without a defect due to the above crack even by use of any one of Varnish Nos. 11, 12 and 13 in Table 3.

<Comparative Examples 4 to 6>

The same procedure as in Example 1 was repeated except for use of each of Varnish Nos. 11, 12, and 13 in Table 3 as the polyimide precursor varnish forming the insulator 10 in Example 1, to manufacture module boards.

In the midway of the manufacturing step, a conductor 11 mainly containing a chromium and nickel was etched from the upper layer, and the resist was stripped using a stripping solution [see FIG. 1(f)]. At this time, it was confirmed that the insulator 10 under the conductor pattern 11 was cracked at a portion under an end portion of the conductor pattern 11, and that part of the lower conductor pattern 8 made from chromium, copper and chromium was etched under the cracked portion.

Next, the board was annealed using hydrogen gas at 350° C. for 30 min. At this time, part of the conductor pattern 11 was stripped with the insulator 10 originating from the crack of the lower insulator 10. Eventually, it failed to complete any module board even by use of any one of Varnish Nos. 11, 12 and 13 in Table 3.

Industrial Applicability

As described above in detail, the object of the present invention can be achieved by the circuit board and the method of manufacturing the circuit board according to the present invention. To be more specific, as described in the inventive examples and comparative examples, a film of the polyimide produced from the polyimide precursor used in the present invention is small in film stress, large in tensile strength, and good in adhesiveness with an upper metal film made from chromium or the like, and accordingly, even when a conducting layer made from nickel being large in film stress is formed on the polyamide film, no crack occurs in the polyimide film or the upper metal layer is not stripped from the polyimide film.

Further, since a conductor pattern having a wide area is provided on the ceramic board to make easy connection to the thin film circuit, the ceramic board is less susceptible to failure. The present invention also provides the method in which a wiring defect caused in the ceramic board is corrected on the thin film circuit side. As a result, the present invention is suitable for a highly reliable wiring board such as a module board and a method of stably manufacturing the circuit board.

We claim:

1. A circuit board comprising:
   a thick film wiring board; and
   a thin film layer formed on said thick film-wiring board;
   wherein said thick film wiring board is electrically connected to said thin film layer through a first thick film conductor pattern and a first thin film conductor pattern;
   an area of a portion of said first thick film conductor pattern which portion is exposed from a front surface of said thick film wiring board is larger than an area of a portion of said first thin film conductor pattern which portion is in contact with said first thick film conductor pattern; and
   the portion of said first thick film conductor pattern which portion is exposed from the front surface of said thick film wiring board is formed in an approximately square shape.

2. A circuit board comprising:
   a thick film wiring board; and
   a thin film layer formed on said thick film wiring board;
   said thick film wiring board is electrically connected to said thin film layer through a first thick film conductor pattern and a first thin film conductor pattern;
   a first insulator is formed on said first thick film conductor pattern in such a manner that said first thin film conductor pattern partially passes through said first insulator and is brought in contact with said first thick film conductor pattern;
   an area of a portion of said first thick film conductor pattern which portion is exposed from a front surface of said thick film wiring board is larger than an area of a portion of said first thin film conductor pattern which portion is in contact with said first thick film conductor pattern; and
   the portion of said first thick film conductor pattern which portion is exposed from the front surface of said thick film wiring board is formed in an approximately square shape.

3. A circuit board comprising:
   a thick film wiring board having a first conductor pattern; and
   a thin film layer laminated on said first conductor pattern;
   wherein said thin film layer comprises:
      a first insulator on said first conductor pattern;
      a second insulator on said first insulator;
      a second conductor pattern formed on said first insulator in such a manner as to partially pass through said first insulator and to be electrically connected to said first conductor pattern;
      a wiring pattern for circuit correction formed on said first insulator; and
      a third conductor pattern passing through said second insulator and electrically connected to said second conductor pattern.

4. A circuit board according to claim 3, wherein electric parts are mounted on said thin film layer in such a manner as to be electrically connected to said thick film wiring board through said thin film layer.

5. A circuit board according to claim 3 or 4, wherein said first conductor pattern is formed substantially into a square shape.

6. A circuit board according to any one of claims 3 or 4, wherein each of said second and third conductor patterns comprises a pattern for supplying a power source and/or a pattern for transmitting a signal.

7. A circuit board according to claim 6, wherein of said second conductor pattern, said pattern for supplying a power source is configured to be different in shape from said pattern for transmitting a signal.

8. A circuit board according to claim 3, wherein either or each of said second conductor pattern and said wiring pattern for circuit correction is formed of a conductor having a structure in which a copper layer is sandwiched from upper and lower sides by layers made from at least one kind selected from a group consisting of titanium, chromium, molybdenum and tungsten; and
   said first insulator is made from a polyimide produced from a polyamic acid obtained by polymerization of at least one kind selected from tetracarboxylic acid dihydride components expressed by a chemical formula 1 and at least one kind selected from diamine compounds expressed by a chemical formula 2:

[chemical formula 1]

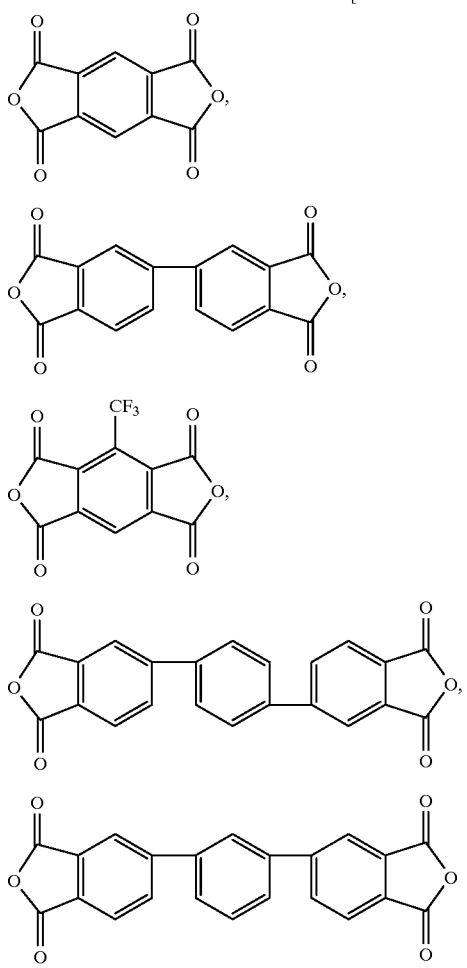

[chemical formula 2]

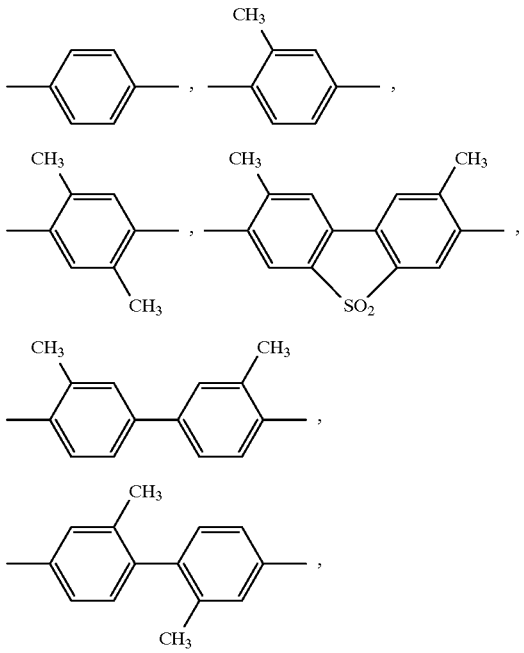

-continued

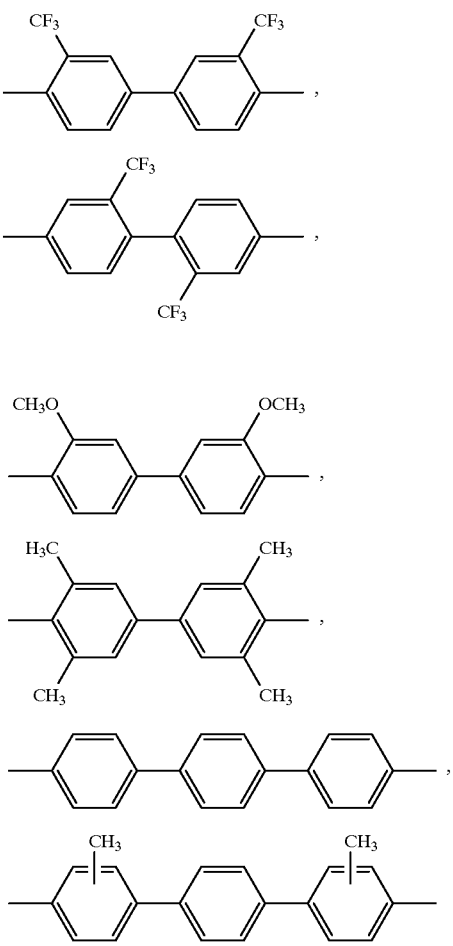

(here, "—" at each terminal of each structural formula means that an amino group is bonded thereto)

9. A circuit board according to claim 3, wherein either or each of said second conductor pattern and said wiring pattern for circuit correction is formed of a conductor having a structure in which a copper layer is sandwiched from upper and lower sides by layers made from at least one kind selected from a group consisting of titanium, chromium, molybdenum and tungsten;

said first insulator is made from a polyimide produced from a polyamic acid obtained by polymerization of at least one kind selected from tetracarboxylic acid dihydride components expressed by the chemical formula 1 and a diamine compound; and when the total amount of said diamine compound is taken as 100 mol, the total mol number of at least one kind selected from diamine compounds expressed by a chemical formula 3 is in a range of 0 to 95 mol and the total mol number of at least one kind selected from diamine compounds expressed by a chemical formula 4 is in a range of 5 to 100 mol:

[chemical formula 1]

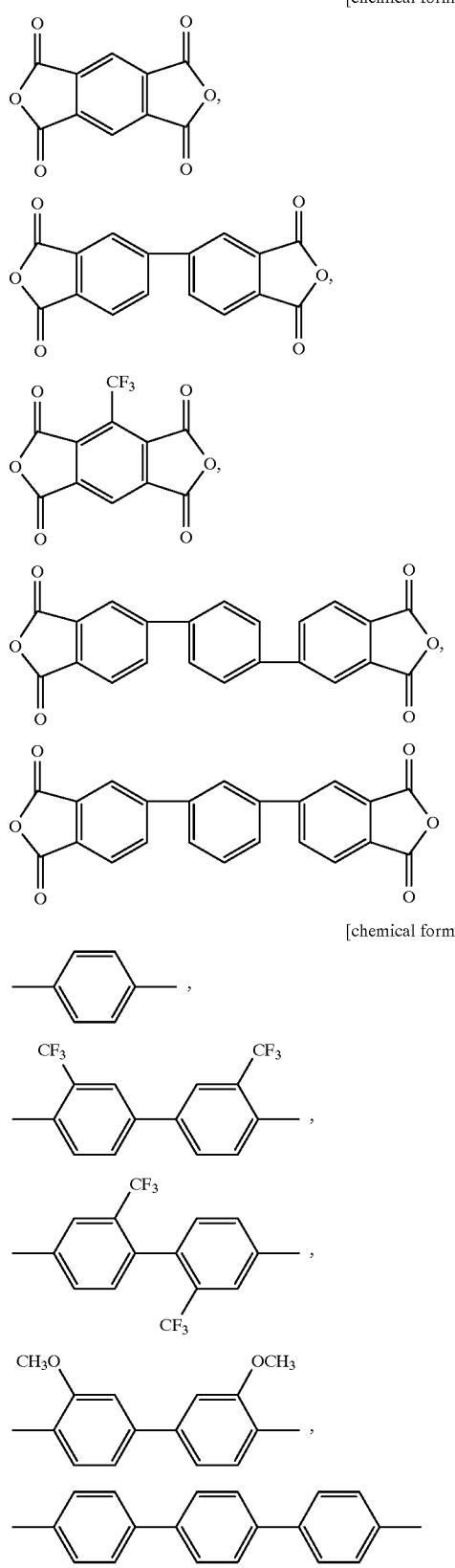

[chemical formula 3]

(here, "—" at each terminal of each structural formula means that an amino group is bonded thereto)

[chemical formula 4]

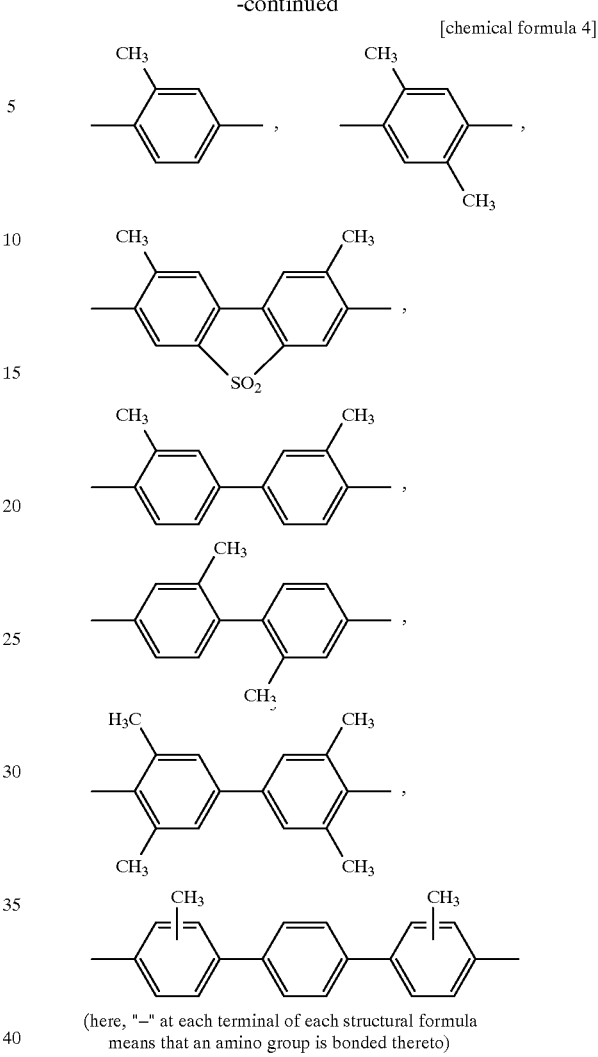

(here, "—" at each terminal of each structural formula means that an amino group is bonded thereto)

10. A circuit board according to claim 3, wherein either or each of said second conductor pattern and said wiring pattern for circuit correction is formed of a conductor having a structure in which a copper layer is sandwiched from upper and lower sides by layers made from at least one kind selected from a group consisting of titanium, chromium, molybdenum and tungsten;

said first insulator is made from a polyimide produced from a polyamic acid obtained by polymerization of a tertacarboxylic acid dihydride component and a diamine compound; and when the total amount of said tertacaboxylic acid dihydride compound is taken as 100 mol, the total mol number of at least one kind selected from tertacaboxylic acid dihydride compounds expressed by the chemical formula 1 is in a range of 60 to 100 mol and the total mol number of at least one kind selected from tertacaboxylic acid dihydride compounds expressed by a chemical formula 5 is in a range of 0 to 40 mol, and when the total amount of said diamine compound is taken as 100 mol, the total mol number of at least one kind selected from diamine compounds expressed by the chemical formula 2 is in a range of 60 to 95 mol and the total mol number of at least one kind selected from diamine compounds expressed by a chemical formula 6 is in a range of 5 to 40 mol:
[chemical formula 1]
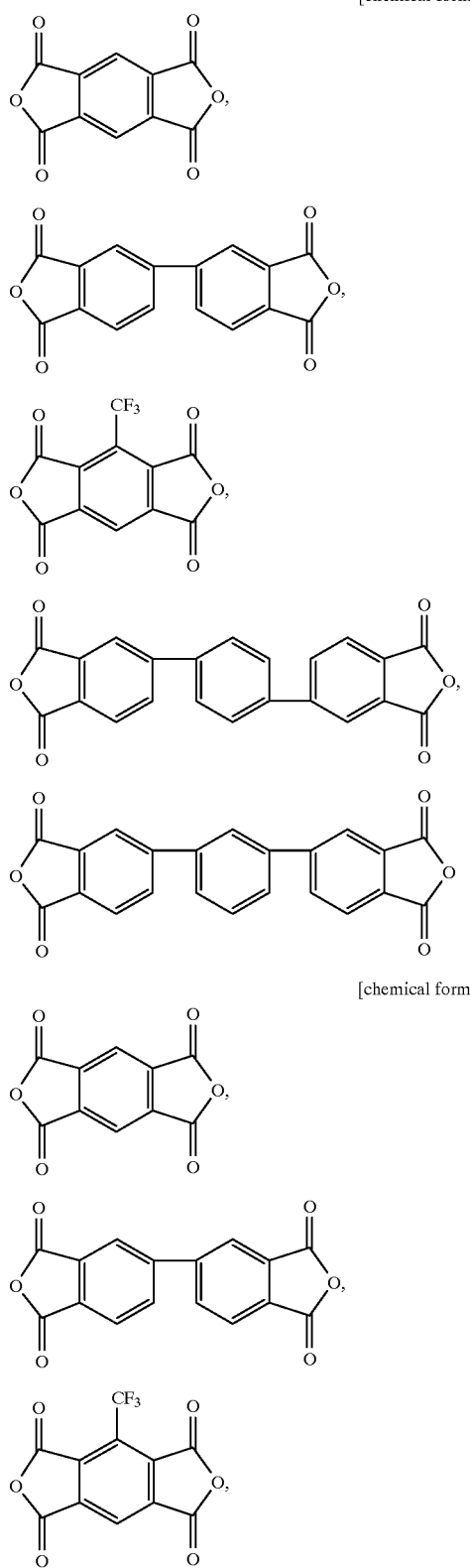
[chemical formula 5]
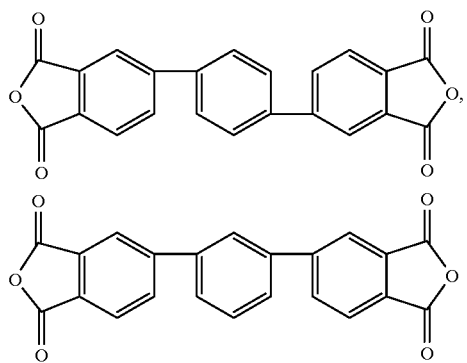
[chemical formula 2]
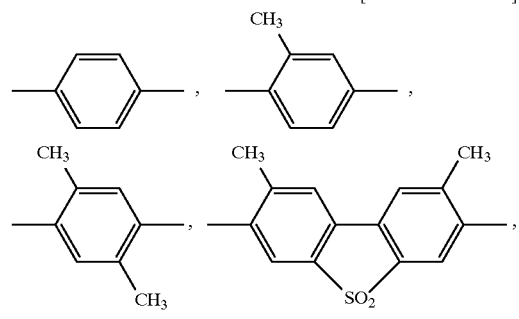
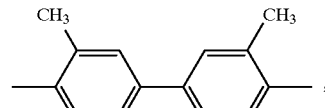
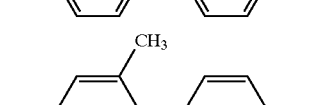
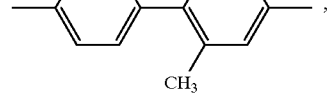
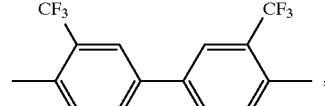
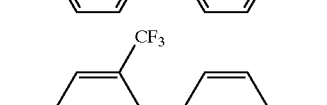
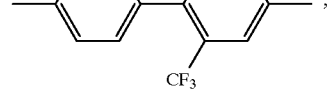

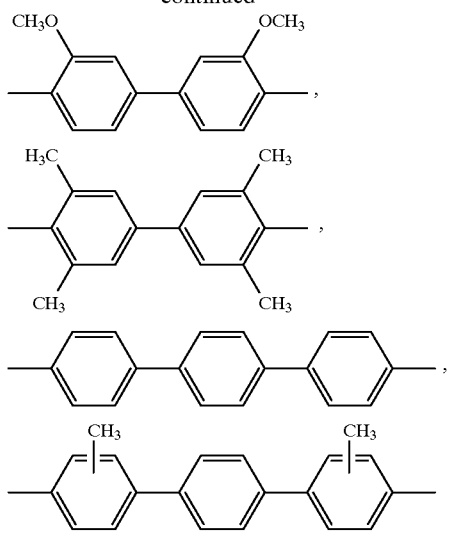

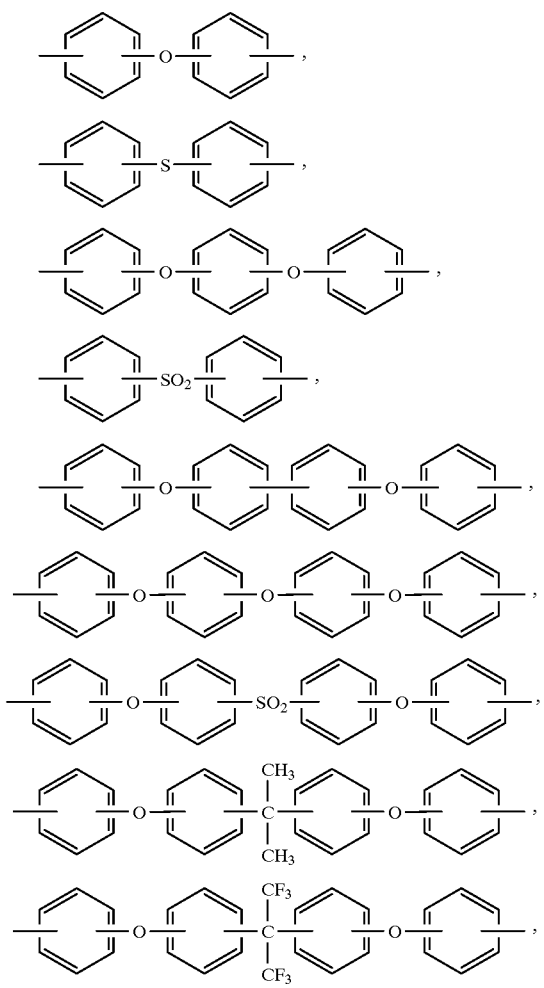

(here, "—" at each terminal of each structural formula means that an amino group is bonded thereto)

11. A circuit board according to claim 3, wherein said third conductor is formed of a conductor having a structure in which at least a nickel layer is formed on layers made from at least one kind selected from a group consisting of titanium, chromium, molybdenum and tungsten; and said second insulator is made from a polyimide produced from a polyamic acid obtained by polymerization of at least one kind selected from tetracarboxylic acid dihydride components expressed by the chemical formula 1 and at least one kind selected from diamine compounds expressed by the chemical formula 2:

[chemical formula 1]

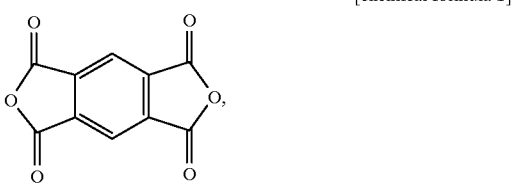

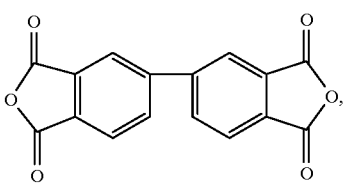

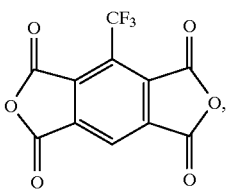

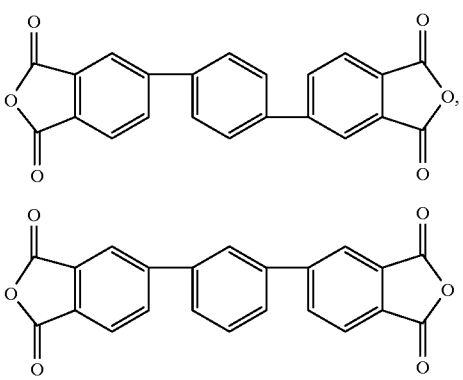

[chemical formula 2]

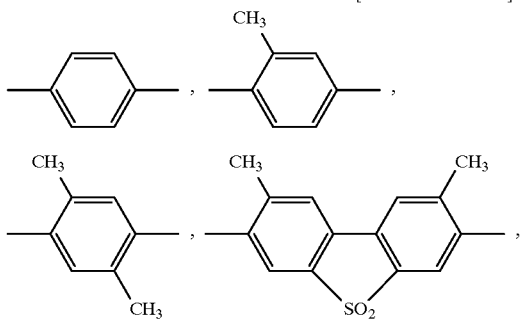

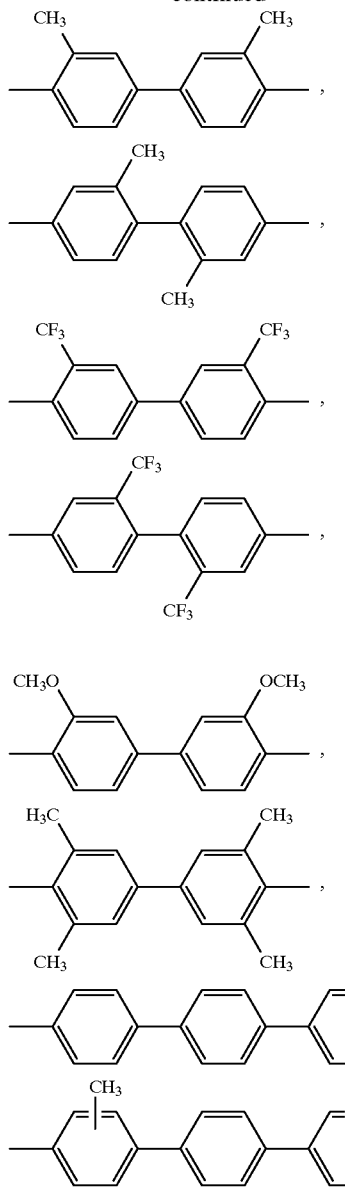

(here, "—" at each terminal of each structural formula means that an amino group is bonded thereto)

12. A circuit board according to claim 3, wherein; said third conductor is formed of a conductor having a structure in which at least a nickel layer is formed on layers made from at least one kind selected from a group consisting of titanium, chromium, molybdenum and tungsten;
said second insulator is made from a polyimide produced from a polyamic acid obtained by polymerization of at least one kind selected from tetracarboxylic acid dihydride components expressed by the chemical formula 1 and a diamine compound; and
when the total amount of said diamine compound is taken as 100 mol, the total mol number of at least one kind selected from diamine compounds expressed by the chemical formula 3 is in a range of 0 to 95 mol and the total mol number of at least one kind selected from diamine compounds expressed by the chemical formula 4 is in a range of 5 to 100 mol:

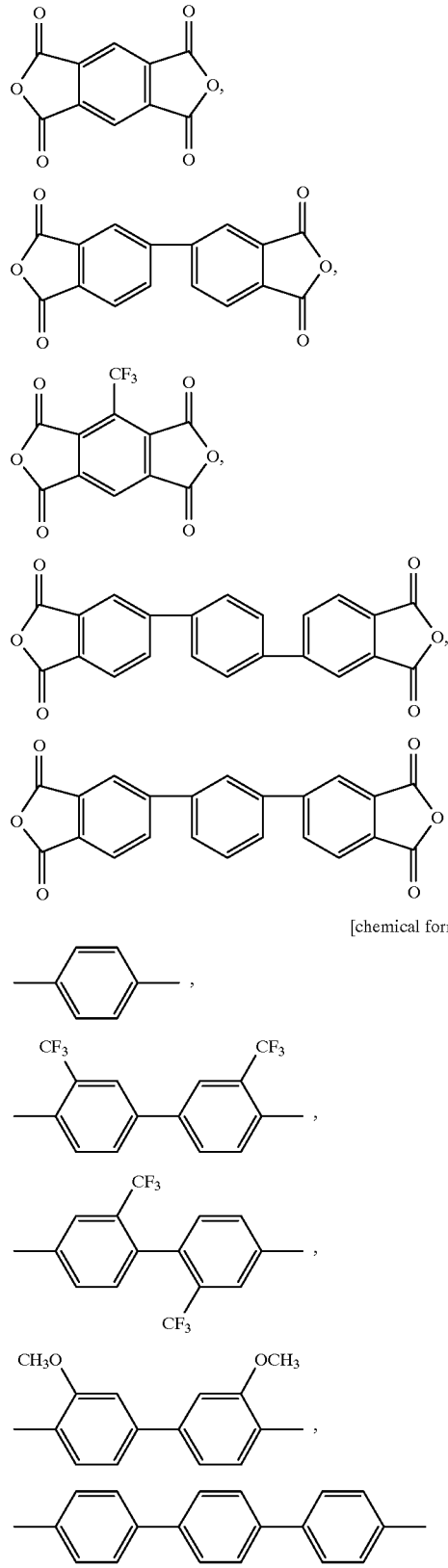

(here, "—" at each terminal of each structural formula means that an amino group is bonded thereto)

-continued

[chemical formula 4]

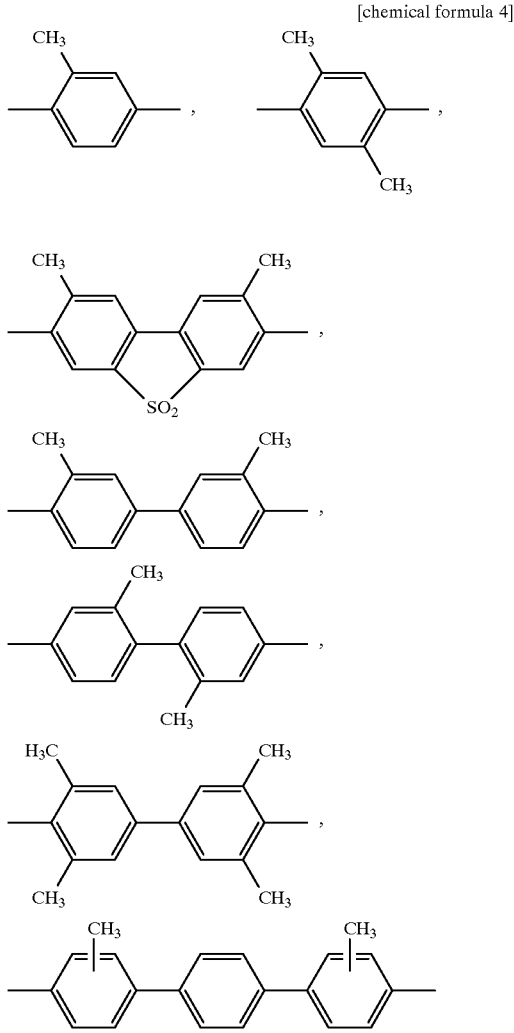

(here, "—" at each terminal of each structural formula means that an amino group is bonded thereto)

13. A circuit board according to claim 3, wherein said third conductor is formed of a conductor having a structure in which at least a nickel layer is formed on layers made from at least one kind selected from a group consisting of titanium, chromium, molybdenum and tungsten;

said second insulator is made from a polyimide produced from a polyamic acid obtained by polymerization of a tertacarboxylic acid dihydride component and a diamine compound; and when the total amount of said tertacaboxylic acid dihydride compound is taken as 100 mol, the total mol number of at least one kind selected from tertacaboxylic acid dihydride compounds expressed by the chemical formula 1 is in a range of 60 to 100 mol and the total mol number of at least one kind selected from tertacaboxylic acid dihydride compounds expressed by the chemical formula 5 is in a range of 0 to 40 mol, and when the total amount of said diamine compound is taken as 100 mol, the total mol number of at least one kind selected from diamine compounds expressed by the chemical formula 2 is in a range of 60 to 95 mol and the total mol number of at least one kind selected from diamine compounds expressed by the chemical formula 6 is in a range of 5 to 40 mol:

[chemical formula 1]

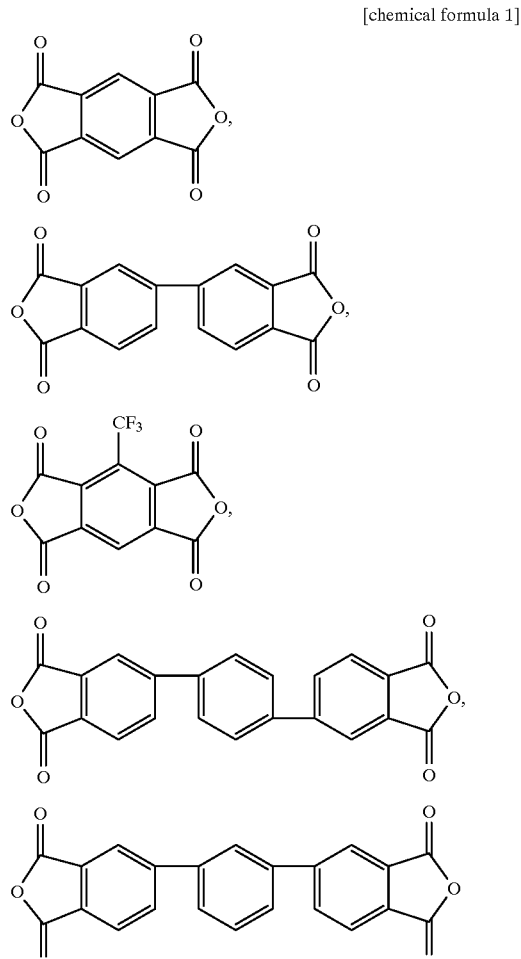

[chemical formula 5]

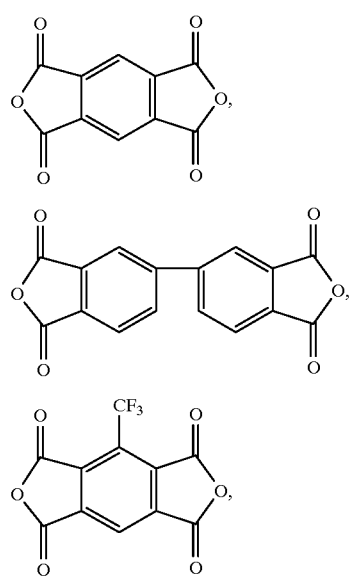

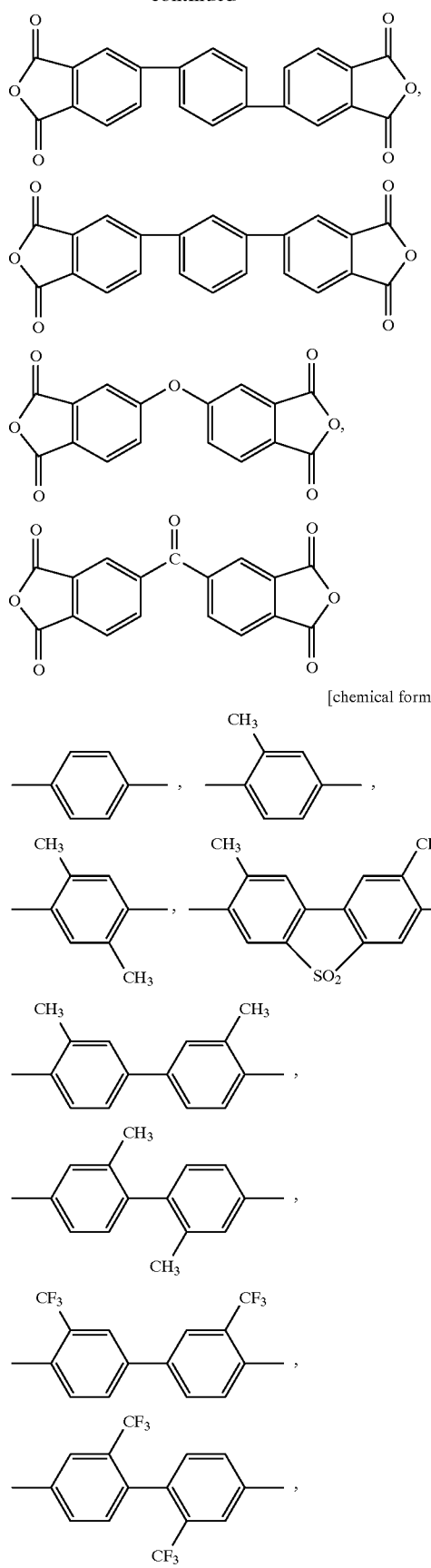
[chemical formula 2]
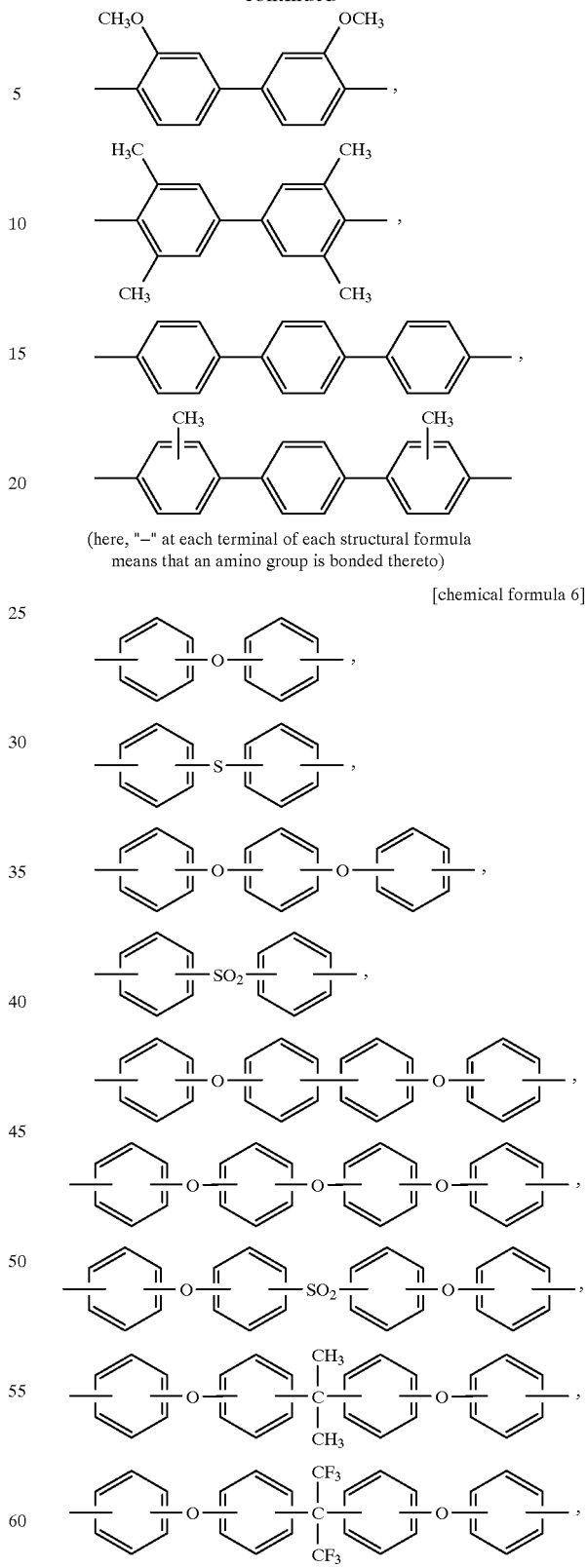
(here, "–" at each terminal of each structural formula means that an amino group is bonded thereto)
[chemical formula 6]
(here, "–" at each terminal of each structural formula means that an amino group is bonded thereto)

14. A circuit board according to claim 3, wherein said thin film layer further comprises a fourth conductor pattern formed on said first insulator in such a manner as to be electrically connected to both said wiring pattern for circuit correction and said third conductor pattern and to be electrically insulated from said first conductor pattern.

15. A circuit board according to claim 14, wherein said first insulator of said thin film layer is of a structure having at least two layers.

16. A circuit board according to claim 3, wherein said first conductor pattern is made from copper, and aminosilane is applied to at least said first conductor pattern.

17. A circuit board according to claim 3, wherein said first conductor pattern is made from copper, and a cuprous oxide film and/or a cupric oxide film are formed on at least said first conductor pattern and aminosilane is applied thereon.

18. A circuit board according to claim 3, wherein said first conductor pattern is made from copper, and nickel plating is applied on at least said first conductor pattern.

19. A circuit board according to claim 3, wherein said first conductor pattern is made from copper, and nickel plating is applied on at least said first conductor pattern and aminisilane is further applied thereon.

20. A circuit board according to claim 3, wherein said first conductor pattern is made from copper, and nickel plating is applied on at least said first conductor pattern, a nickel oxide film is formed on a surface of the nickel film, and aminosilane is applied thereon.

21. A method of manufacturing a circuit board described in claim 3 in accordance with the following steps (1) to (7):

(1) forming a first polyimide or a precursor thereof on a thick film wiring board having a first conductor pattern;
   (2) forming a second polyimide precursor on said first polyimide or precursor thereof;
   (3) forming a photoresist on said second polyimide precursor, followed by exposure and development of said photoresist, to form a resist pattern, and processing said second polyimide precursor using said resist pattern as a mask;
   (4) stripping said photoresist;
   (5) curing said first polyimide or precursor thereof and said second polyimide precursor by heating;
   (6) processing, by ashing or dry etching, a cured substance obtained from said first polyimide or precursor thereof by heating, using as a mask a pattern of a cured substance obtained from said second polyimide precursor by heating, to expose said first conductor pattern; and
   (7) depositing a conductor material for forming a second conductor pattern.

22. A method of manufacturing a circuit board described in claim 14 in accordance with the following steps (1) to (9):

(1) forming a first polyimide or a precursor thereof on a thick film wiring board having a first conductor pattern;
   (2) forming a second polyimide precursor on said first polyimide or precursor thereof;
   (3) forming a photoresist on said second polyimide precursor, followed by exposure and development of said photoresist, to form a resist pattern, and processing said second polyimide precursor using said photoresist as a mask;
   (4) stripping said photoresist;
   (5) locally applying a third polyimide precursor;
   (6) curing said first polyimide or precursor thereof, said second polyimide precursor, and said third polyimide precursor by heating;
   (7) processing, by ashing or dry etching, a cured substance obtained from said first polyimide or precursor thereof by heating using as a mask a pattern of a cured substance obtained from said second polyimide precursor by heating, to expose said first conductor pattern;
   (8) depositing conductor materials for forming a second conductor pattern, a fourth conductor pattern, and/or a wiring pattern for circuit correction; and
   (9) processing said conductor materials using negative-type resists, to form said second conductor pattern, said fourth conductor pattern, and/or said wiring pattern for circuit correction.

23. A method of manufacturing a circuit board described in claim 14 in accordance with the following steps (1) to (8):

(1) forming a first polyimide or a precursor thereof on a thick film wiring board having a first conductor pattern;
   (2) forming a second polyimide precursor on said first polyimide or precursor thereof;
   (3) forming a negative-type photoresist on said second polyimide precursor, followed by exposure, development and ashing of said photoresist, to form a resist pattern, and processing said second polyimide precursor using said resist pattern as a mask;
   (4) stripping said photoresist;
   (5) curing said first polyimide or precursor thereof, said second polyimide precursor, and said third polyimide precursor by heating;
   (6) processing, by ashing or dry etching, a cured substance obtained by said first polyimide or precursor thereof by heating using as a mask a pattern of a cured substance obtained from said second polyimide precursor by heating, to expose said first conductor pattern;
   (7) depositing conductor materials for a second conductor pattern, a fourth conductor pattern, and/or a wiring pattern for circuit correction; and
   (8) processing said conductor materials using a negative-type resists, to form said second conductor a pattern, said fourth conductor pattern and/or said wiring pattern for circuit correction.

* * * * *